(12) United States Patent
Snee et al.

(10) Patent No.: US 8,891,575 B2
(45) Date of Patent: Nov. 18, 2014

(54) OPTICAL FEEDBACK STRUCTURES AND METHODS OF MAKING

(75) Inventors: Preston T. Snee, Cambridge, MA (US); Yin Thai Chan, Cambridge, MA (US); Daniel G. Nocera, Cambridge, MA (US); Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 2131 days.

(21) Appl. No.: 11/288,321

(22) Filed: Nov. 29, 2005

(65) Prior Publication Data

US 2006/0114960 A1    Jun. 1, 2006

Related U.S. Application Data

(60) Provisional application No. 60/631,427, filed on Nov. 30, 2004.

(51) Int. Cl.
*H01S 3/06* (2006.01)

(52) U.S. Cl.
USPC ............. 372/67; 372/43.01; 372/70; 372/102

(58) Field of Classification Search
USPC ............. 372/36, 43.01, 50.11, 66–68, 70–75, 372/102, 32; 257/E33.011–E31.001; 438/478–509
See application file for complete search history.

(56) References Cited

U.S. PATENT DOCUMENTS

| | | |
|---|---|---|
| 5,260,957 A | 11/1993 | Hakimi et al. |
| 5,293,050 A | 3/1994 | Chapple-Sokol et al. |
| 5,354,707 A | 10/1994 | Chapple-Sokol et al. |
| 5,422,489 A | 6/1995 | Bhargava |
| 5,505,928 A | 4/1996 | Alivisatos et al. |
| 5,512,131 A | 4/1996 | Kumar et al. |
| 5,525,377 A | 6/1996 | Gallagher et al. |
| 5,537,000 A | 7/1996 | Alivisatos et al. |
| 5,585,640 A | 12/1996 | Huston et al. |
| 5,613,140 A | 3/1997 | Taira |
| 5,677,545 A | 10/1997 | Shi et al. |
| 5,751,018 A | 5/1998 | Alivisatos et al. |
| 5,897,945 A | 4/1999 | Lieber et al. |
| 5,958,573 A | 9/1999 | Spitler et al. |

(Continued)

FOREIGN PATENT DOCUMENTS

| | | |
|---|---|---|
| EP | 1 198 038 A | 4/2002 |
| WO | WO 96/10282 | 4/1996 |

(Continued)

OTHER PUBLICATIONS

Chan Yinthai et al: "Incorporation of luminescent nanocrystal into monodisperse core-shell silica microspheres"; Advanced Materials, Dec. 27, 2004, vol. 16, No. 23-24, Nov. 17, 2004, pp. 2092-2097.*

(Continued)

*Primary Examiner* — Xinning Niu
(74) *Attorney, Agent, or Firm* — Steptoe & Johnson LLP

(57) ABSTRACT

An optical resonator can include an optical feedback structure disposed on a substrate, and a composite including a matrix including a chromophore. The composite disposed on the substrate and in optical communication with the optical feedback structure. The chromophore can be a semiconductor nanocrystal. The resonator can provide laser emission when excited.

43 Claims, 14 Drawing Sheets

(56) References Cited

U.S. PATENT DOCUMENTS

| | | | |
|---|---|---|---|
| 6,103,868 | A | 8/2000 | Heath et al. |
| 6,157,047 | A | 12/2000 | Fujita et al. |
| 6,180,239 | B1 | 1/2001 | Whitesides et al. |
| 6,207,229 | B1 | 3/2001 | Bawendi et al. |
| 6,236,060 | B1 | 5/2001 | Chan et al. |
| 6,251,303 | B1 | 6/2001 | Bawendi et al. |
| 6,294,401 | B1 | 9/2001 | Jacobson et al. |
| 6,322,901 | B1 | 11/2001 | Bawendi et al. |
| 6,339,605 | B1 * | 1/2002 | Vetrovec .......................... 372/35 |
| 6,379,635 | B2 | 4/2002 | O'Brien et al. |
| 6,447,698 | B1 | 9/2002 | Ihara et al. |
| 6,501,091 | B1 | 12/2002 | Bawendi et al. |
| 6,518,168 | B1 | 2/2003 | Clem et al. |
| 6,576,291 | B2 | 6/2003 | Bawendi et al. |
| 6,607,829 | B1 | 8/2003 | Bawendi et al. |
| 6,617,583 | B1 | 9/2003 | Bawendi et al. |
| 6,759,199 | B2 | 7/2004 | Mirkin et al. |
| 6,797,412 | B1 | 9/2004 | Jain et al. |
| 6,803,719 | B1 | 10/2004 | Miller et al. |
| 6,846,565 | B2 | 1/2005 | Korgel et al. |
| 6,864,626 | B1 | 3/2005 | Weiss et al. |
| 6,873,631 | B2 * | 3/2005 | Yao et al. ........................ 372/32 |
| 7,160,613 | B2 | 1/2007 | Bawendi et al. |
| 7,229,690 | B2 | 6/2007 | Chan et al. |
| 2001/0002275 | A1 * | 5/2001 | Oldenburg et al. ........... 427/214 |
| 2001/0005495 | A1 | 6/2001 | O'Brien et al. |
| 2002/0080842 | A1 * | 6/2002 | An et al. ........................ 372/92 |
| 2003/0017264 | A1 | 1/2003 | Treadway et al. |
| 2003/0042850 | A1 | 3/2003 | Bertram et al. |
| 2003/0142944 | A1 | 7/2003 | Sundar et al. |
| 2004/0004982 | A1 | 1/2004 | Eisler et al. |
| 2004/0017834 | A1 * | 1/2004 | Sundar et al. ................... 372/39 |
| 2004/0023010 | A1 | 2/2004 | Bulovic et al. |
| 2004/0091710 | A1 | 5/2004 | Bawendi et al. |
| 2004/0110002 | A1 | 6/2004 | Kim et al. |
| 2004/0265622 | A1 | 12/2004 | Sadasivan et al. |
| 2005/0258418 | A1 | 11/2005 | Steckel et al. |
| 2006/0019098 | A1 | 1/2006 | Chan et al. |
| 2006/0159901 | A1 | 7/2006 | Tischler et al. |
| 2006/0196375 | A1 | 9/2006 | Coe-Sullivan et al. |

FOREIGN PATENT DOCUMENTS

| | | |
|---|---|---|
| WO | WO 97/10175 | 3/1997 |
| WO | WO 99/26299 | 5/1999 |
| WO | WO 2005004253 | 1/2005 |
| WO | WO 2005017951 | 2/2005 |

OTHER PUBLICATIONS

Y. Chan et al: "Multiexcitonic two-state lasing in a CdSe nanocrystal laser"; Applied Physics Letters, Sep. 27, 2004, vol. 85, No. 13, pp. 2060-2062.*
Artemyev, "Optical Properties of Quantum Dots in Photonic Dots," *Proceedings of the Spie—The International Society for Optical Engineering Spi.*, vol. 4808, 2002, pp. 136-145.
Chan, et al., "A Solvent-stable Nanocrystal-Silica Composite Laser," *Journal of American Chemical Society*, vol. 128, Feb. 15, 2006, pp. 3146-3147.
Chan, et al., "Blue Semiconductor Nanocrystal Laser," *Applied Physics Letters, American Institute of Physics*, Feb. 7, 2005, vol. 86, No. 7. pp. 73102.
Chan, et al., "Incorporation of Luminescent Nanocrystals into Monodisperse Core-Shell Silica Microspheres," *Advanced Materials*, Dec. 27, 2004, vol. 16, No. 23-24, pp. 2092-2097.
Chan, et al., "Multiexcitonic Two-State Lasing in a CdSe Nanocrystal Laser," *Applied Physics Letters, American Institute of Physics*, vol. 85, No. 13, Sep. 27, 2004, pp. 2460-2462.
Petruska, et al., "High-performance, Quantum Dot Nanocomposites for Nonlinear Optical and Optical Gain Applications," *Advanced Materials*, Apr. 17, 2003, vol. 15, No. 7-8, pp. 610-613.
Snee, et al., "Whispering-Gallery-Mode Lasing From a Semiconductor Nanocrystal/Microsphere Resonator Composite," *Advanced Materials*, May 2, 2005, vol. 17, No. 9 pp. 1131-1136.
Sundar, et al., "Soft-Lithographically Embossed, Multilayered Distributed-Feedback Nanocrystal Lasers," *Advanced Materials*, Dec. 27, 2004, vol. 16, No. 23-24, pp. 2137-2141.
Aktsipetrov et al. "Generation of reflected second harmonic at semiconductor quantum dots," JETP Letters, vol. 55, No. 8, 435-439 (1992).
Alivisatos, "Perspectives on the Physical Chemistry of Semiconductor Nanocrystals" J. Phys. Chem. 1996(100):13226-13239, 1996.
Baltramiejunas et al., "Rapid Processes of Darkening and Bleaching in CdS Doped Glasses," Superlattices and Microstructures vol. 10, No. 3, 307-310 (1990).
Baltrameyunas et al., "Fast switching of the transmission of light by glasses activated with CdS microcrystals," Sov. Phys. Semicond., vol. 25 No. 2, 164-166 (1991).
Bhargava et al., "Quantum Confined Atoms of Doped ZnO Nanocrystals", Phys. Stat. Sol (b) 229, No. 2, 897-901 (2002).
Bohren, C. F.; Huffman, D. R.; "Absorption and Scattering of Light by Small Particles" (Wiley, 1998).
Chamarro et al., "Enhancement of Exciton Exchange Interaction by Quantum Confinement in CdSe Nanocrystals," Jpn. J. Appl. Phys, vol. 34, 12-14 (1994).
Chamarro et al., "Size-dependent Electron-Hole Exchange Interaction in CdSe Quantum Dots, Il Nuovo Cimento," vol. 17, Nos. 11-12, (1995) 1407-1412.
Chamarro et al., "Enhancement of electron-hole exchange interaction in CdSe nanocrystals; A quantum confinement effect," Physical Review B, vol. 53, No. 3, Jan. 15, 1996-I, 1336-1342.
Chepic et al., "Auger ionization of semiconductor quantum drops in a glass matrix," Journal of Luminescence 47 (1990) 113-127 North-Holland.
Coe et al., "Electroluminescence from single monolayers of nanocrystals in molecular organic devices," *Nature* 2002, 420, 800-803.
Coe-Sullivan et al., "Large-Area Ordered Quantum-Dot Monolayers via Phase Separation During Spin-Casting", Advanced Functional Materials, 15, 1117-1124 (2005).
Colvin et al., "Light-emitting diodes made from cadmium selenide nanocrystals and a semiconducting polymer" Nature 370(6488):354-357, Aug. 4, 1994.
Dabbousi et al., "Electroluminescence from CdSe quantum-dot/polymer composites" Appl. Phys. Lett. 66(11):1316-1318, Mar. 13, 1995.
Dabbousi et al., "(CdSe)ZnS Core-Shell Quantum Dots: Synthesis and Characterization of a Size Series of Highly Luminescent Nanocrystallites", J. Phys. Chem. B. 101, 9463 (1997).
Danek et al., "Synthesis of Luminescent Thin-Film CdSe/ZnSe Quantum Dot Composites Using CdSe Quantum Dots Passivated with an Overlayer of ZnSe" Chem. Mater. 8(1):173-180, 1996.
Diehl, "Fraunhofer LUCOLEDs to replace lamps," III-Vs Rev. 10(1), 1997.
Dneproviskii et al., "Time-Resolved Luminescence of CdSe Microcrystals," Solid State Communications, vol. 74, No. 7, pp. 555-557 (1990).
Edamatsu et al., "Subpicosecond dynamics of confined excitons and optical nonlinearities of CuCl quantum dots," Journal of Luminescence 66 & 67 (1996) 406-409.
Efros et al., "Resonance Raman Spectroscopy of Electron-Hole Pairs—Polar Phonon Coupling in Semiconductor Quantum Microcrystals," Solid State Communications, vol. 78, No. 10, 853-856 (1991).
Efros et al., Semiconductor Nanocrystals: from Basic Principles to Applications, Klwer Academic, New York, 2003.
Ekimov et al., "Quantum size effect in three-dimensional microscopic semiconductor crystals," JETP Lett, vol. 34, No. 6, Sep. 20, 1981, pp. 345-349.
Ekimov et al., "Quantum size effect in the optical spectra of semiconductor microcrystals," Sov. Phys. Semicond. 16(7), Jul. 1982, pp. 775-778.
Ekimov et al., "Size quantization of the electron energy spectrum in a microscopic semiconductor crystal," JETP Lett., vol. 40, No. 8, Oct. 25, 1984, pp. 1136-1139.

(56) References Cited

OTHER PUBLICATIONS

Ekimov et al., "Quantum Size Effect in Semiconductor Microcrystals," Solid State Communications, vol. 56, No. 11, pp. 921-924 (1985).
Ekimov et al., "Quantization of the energy spectrum of holes in the adiabatic potential of the electron," JETP Lett., vol. 43, No. 6, Mar. 25, 1986, pp. 376-379.
Ekimov et al., "Nonlinear Optics of Semiconductor-Doped Glasses," Phys. Stat. Sol. (b) 150, (1988) pp. 627-633.
Ekimov et al., "Photoluminescence of quasizero-dimensional semiconductor structures," Sov. Phys. Solid State 31(8), Aug. 1989, pp. 1385-1393.
Ekimov et al., "Donor-like Exciton in Zero-Dimension Semiconductor Structures," Solid State Communications, vol. 69, No. 5, pp. 565-568 (1989).
Ekimov et al., "Influence of high hydrostatic pressures on the exciton spectrum of CdS microcrystals in glass," Sov. Phys. Semicond. 23(9), Sep. 1989, pp. 965-966.
Ekimov et al., "Quantum-Size Stark Effect in Semiconductor Microcrystals," Journal of Luminescence 46 (1990) 97-100 North-Holland.
Ekimov et al., "Spectra and Decay Kinetics of Radiative Recombination in CdS Microcrystals," Journal of Luminescence 46 (1990) 83-95 North-Holland.
Ekimov et al., "Optics of Zero Dimensional Semiconductor Systems, Acta Physica Polonica A," vol. 79 (1991), No. 1. pp. 5-14.
Ekimov, "Optical Properties of Semiconductor Quantum Dots in Glass Matrix," Physica Scripta, vol. T39, 217-222 (1991).
Ekimov et al., "Dimensional Effects in Luminescence Spectra of Zero-Dimensional Semiconductor Structures," Bulletin of the Russian Academy of Sciences, vol. 56, No. 2, pp. 154-157 (Feb. 1992).
Ekimov et al., "Absorption and intensity-dependent photoluminescence measurements on CdSe quantum dots: assignment of the first electronic transitions," Journal of the Optical Society of America, vol. 10, Nos. 1-12, 100-107 (1992).
Ekimov et al., "Growth of CdSe nanocrystals in ion-implanted $SiO_2$ films," Journal of Crystal Growth 151 (1995) 38-45.
Ekimov, "Optical Properties of Oxide Glasses Doped by Semiconductor Nanocrystals," Radiation Effects and Defects in Solids, 1995, vol. 134, 11-22.
Ekimov, "Growth and optical properties of semiconductor nanocrystals in a glass matrix," Journal of Luminescence 70 (1996) 1-20.
Empedocles et al, "Photoluminescence Spectroscopy of Single CdSe Nanocrystallite Quantum Dots" Phys. Rev. Lett. 77(18):3873-3876 (Oct. 1996).
Empedocles et al., "Quantum-Confined Stark Effect in Single CdSe Nanocrystallite Quantum Dots" Science 278:2114-2117 (Dec. 1997).
Grabovskis, et al., "Photoionization of semiconducting microcrystals in glass," Sov. Phys. Solid State 31(1), Jan. 1989, pp. 149-151.
Guha et al., "Hybrid organic-inorganic semiconductor-based light-emitting diodes" J. Appl. Phys. 82(8):4126-4128 (Oct. 15, 1997).
Gurevich et al., "Growth of CdS nanocrystals in silicate glasses and in thin $SIO_2$ films in the Initial states of the phase separation of a solid solution," Semiconductors, 28 (5), May 1994, 486-493.
Gurevich et al. "Preparation and investigation of $SIO_2$ films activated by CdS semiconductor nanocrystals," Soviet Physics Semiconductors, vol. 26, 57-59 (1992).
Hines et al., "Synthesis and Characterization of Strongly Luminescing ZnS-Capped CdSe Nanocrystals" J. Phys. Chem. 100:468-471 (Jan. 1996).
Itoh et al., "Interface effects on the properties of confined excitons in CuCl microcrystals," Journal of Luminescence 60 & 61 (1994) 396-399.
Itoh et al., "Polaron and Exciton-Phonon Complexes in CuCl Nanocrystals," Physical Review Letters, vol. 74, No. 9, Feb. 27, 1995, 1645-1648.
Itoh et al., "Subpicosecond dynamics of confined excitons in CuCl nanocrystals," Materials Science and Engineering A217/218 (1996) 167-170.
Jursenas et al., "Surface Recombination of Nonequilibrium Electron-Hole Plasma in Laser-Modified Semiconductor-Doped Glasses," Solid State Communications, vol. 87, No. 6, 577-580 (1993).
Kagan et al., "Electronic Energy Transfer in CdSe Quantum Dot Solids," Physical Review Letters, 76:1517-1520 (1996).
Kagan et al., "Long-range resonance transfer of electronic excitations in close-packed CdSe quantum-dot solids," Physical Review Letters, 54:8633-8643 (Sep. 15, 1996).
Kortan et al., "Nucleation and Growth of CdSe on ZnS Quantum Crystallite Seeds, and Vice Versa, In Inverse Micelle Media" J. Am Chem. Soc. 112:1327-1332 (1990).
Kuno et al., "The band edge luminescence of surface modified CdSe nanocrystallites: Probing the luminescing state" J. Chem. Phys. 106(23):9869-9882 (Jun. 1997).
Lawless et al., "Bifunctional Capping of CdS Nanoparticles and Bridging to TiO2" J. Phys. Chem. 99:10329-10335 (1995).
Leatherdale et al., "Photoconductivity in CdSe Quantum Dot Solids," vol. 62, No. 4, pp. 2669-2680, (Jul. 15, 2000).
Lublinskaya et al., "CdS nanocrystal growth in thin silica films: evolution of size distribution function", Journal of Crystal Growth 184/185 (1998) 360-364.
Matsumoto et al., "Preparation of Monodisperse CdS Nanocrystals by Size Selective Photocorrosion", J. Phys. Chem.100(32):13781-13785 (1996).
Mattoussi et al., "Electroluminescence from heterostructures of poly(phenylene vinylene) and inorganic CdSe nanocrystals," J. Appl. Phys. 83(12): 7965-7974, 1998.
Murray et al., "Synthesis and Characterization of Nearly Monodisperse CdE (E=S, Se, Te) Semiconductor Nanocrystallites", J. Am. Chem. Soc. 115(19):8706-8715 (1993).
Nirmal et al., "Fluorescence Intermittency in single Cadmium Selenide Nanocrystals" Nature 383:802-804 (Oct. 1996).
Saviot et al., "Effects of Resonance on Low-Frequency Raman Scattering From Semiconductor Nanocrystals," Radiation Effects and Defects in Solids, 1995, vol. 137, 45-50.
Saviot et al., "Size dependence of acoustic and optical vibrational modes of CdSe nanocrystals in glasses," Journal of Non-Crystalline Solids 197 (1996) 238-246.
Saviot et al., "Size-selective resonant Raman scattering in CdS doped glasses," Physical Review B, vol. 57, No. 1, Jan. 1, 1998-I, 341-346.
Schlamp et al., "Improved efficiencies in light emitting diodes made with CdSe(CdS) core/shell type nanocrystals and a semiconducting polymer", J. Appl. Phys., 82, 5837-5842 (1997).
Sirenko et al., "Spin-flip and acoustic-phonon Raman scattering in CdS nanocrystals", Physical Review B, vol. 58, No. 4, 15 (Jul. 1998-II), 2077-2087.
Spanhel et al., "Photochemistry of Colloidal Semiconductors. Surface Modification and Stability of Strong Luminescing CdS Particles" J. Am. Chem. Soc.109(19):5649-5655 (1987).
Tamulaitis et al., "Dynamics of Nonlinear Optical Response of CuBr-Doped Glasses," Superlattices and Microstructures, vol. 3, No. 2, 199-202 (1993).
Tischler et al., "Strong Coupling in a Microcavity LED," Phys. Rev. Lett. 2005, 95, 036401.
Valenta et al., "Dynamics of excitons in CuBr nanocrystals: Spectral-hole burning and transient four-wave-mixing measurements," Physical Review B, vol. 57, No. 3, Jan. 15, 1998-I, 1774-1783.
Vandyshev et al., "Nonlinear optical properties of semiconductor microcrystals," JETP Lett., vol. 46, No. 10, Nov. 25, 1987 pp. 435-439.
Volkov et al., "Oscillations of polarization of recombination radiation of a variable gap semiconductor in a magnetic field," JETP Lett., vol. 25 No. 55, 526-528 (1977).
Armani, et al., "Ultra-high-Q toroid microcavity on a chip," *Nature* 2003, 421, 925.
Artemyev et al., "Quantum dots in photonic dots," *Appl. Phys. Lett.* 2000, 76, 1353-1355.
Artemyev et al., "Light Trapped in a Photonic Dot: Microspheres Act as a Cavity for Quantum Dot Emission," *Nano Lett.* 2001, 1, 309-314.

(56) References Cited

OTHER PUBLICATIONS

Bogush et al., "Preparation of monodisperse silica particles: Control of size and mass fraction," *J. Non-Cryst. Solids* 1988, 104, 95.

Bruchez et al., "Semiconductor Nanocrystals as Fluorescent Biological Labels," *Science* 1998, 281, 2013-2016.

Caruge et al., "Transient photoluminescence and simultaneous amplified spontaneous emission from multiexciton states in CdSe quantum dots," *Phys. Rev. B* 2004, 70, 085316.

Cha et al., "Microcavity Lasing from Block Peptide Hierarchically Assembled Quantum Dot Spherical Resonators," *Nano Lett.* 2003, 3, 907-911.

Chan et al., "Quantum Dot Bioconjugates for Ultrasensitive Nonisotopic Detection," *Science* 1998, 281, 2016-2018.

Correa-Duarte et al., "Stabilization of CdS semiconductor nanoparticles against photodegradation by a silica coating procedure," *Chemical Physics Letters* 1998, 286, 497-501.

Dhas et al., "Surface Synthesis of Zinc Sulfide Nanoparticles on Silica Microspheres: Sonochemical Preparation, Characterization, and Optical Properties," *Chem. Mater.* 1999, 11, 806.

Eisler et al., "Color-selective semiconductor nanocrystal laser," *Appl. Phys. Lett.* 2002, 80, 4614-4616.

Fisher et al., "Emission Intensity Dependence and Single-Exponential Behavior in Single Colloidal Quantum Dot Fluorescence Lifetimes," *J. Phys. Chem. B* 2004, 108, 143.

Gao et al., "Quantum-dot nanocrystals for ultrasensitive biological labeling and multicolor optical encoding," *J. Biomed. Opt.* 2002, 7, 532.

Gao et al., "Doping Mesoporous Materials with Multicolor Quantum Dots," *J. Phys. Chem. B* 2003, 107, 11575.

Gao et al., "Quantum Dot-Encoded Mesoporous Beads with High Brightness and Uniformity: Rapid Readout Using Flow Cytometry," *Anal. Chem.* 2004, 76, 2406.

Garrett et al., "Stimulated Emission into Optical Whispering Modes of Spheres," *Phys. Rev.* 1961, 124, 1807.

Han et al., "Quantum-dot-tagged microbeads for multiplexed optical coding of biomolecules," *Nature Biotech.* 2001, 19, 631-635.

Imhof et al., "Ordered macroporous materials by emulsion templating," *Nature* 1997, 389, 948-951.

Kazes et al., "Lasing from Semiconductor Quantum Rods in a Cylindrical Microcavity," *Adv. Mater.* 2002, 14, 317-321.

Klimov et al., "Optical Gain and Stimulated Emission in Nanocrystal Quantum Dots," *Science* 2000, 290, 314-317.

Klimov et al., "Ultrafast Carrier Dynamics, Optical Amplification, and Lasing in Nanocrystal Quantum Dots," *MRS Bull.* 2001, 26, 998.

Lin et al., "Photonic pseudo-gap-based modification of photoluminescence from CdS nanocrystal satellites around polymer microspheres in a photonic crystal," *Appl. Phys Lett.* 2002, 81, 3134-3136.

Malko et al., "From amplified spontaneous emission to microring lasing using nanocrystal quantum dot solids," *Appl. Phys. Lett.* 2002, 81, 1303-1305.

Mattoussi et al., "Self-Assembly of CdSe-ZnS Quantum Dot Bioconjugates Using an Engineered Recombinant Protein," *J. Am. Chem. Soc.* 2000, 122, 12142-12150.

Norris et al., "Measurement and assignment of the size-dependent optical spectrum in CdSe quantum dots," *Physical Review B* 1996, 53, 16338-16346.

Oraevsky, "Whispering-gallery waves," *Quantum. Electron.* 2002, 32, 377.

Pai et al., *J. Mag. & Magnetic Mater.* 1999, 194, 262.

Rakovich et al., "Whispering gallery mode emission from a composite system of CdTe nanocrystals and a spherical microcavity," *Semicond. Sci. Technol.* 2003, 18, 914-918.

Rogach et al., "'Raisin Bun'—Type Composite Spheres of Silica and Semiconductor Nanocrystals," *Chem. Mater.* 2000, 12, 2676.

Spillane, et al., "Ultralow-threshold Raman laser using a spherical dielectric microcavity," *Nature* 2002, 415, 621.

Stöber et al., "Controlled growth of monodisperse silica spheres in the micron size range," *J. Colloid Interface Sci.*, 1968, 26, 62.

Sundar et al., "Room-Temperature, Tunable Gain Media from Novel II-VI Nanocrystal-Titania Composite Matrices," *Adv. Mater.* 2002, 14, 739-743.

Tzeng, et al., "Laser emission from individual droplets at wavelengths corresponding to morphology-dependent resonances," *Opt. Lett.* 1984, 9, 499.

van Blaaderen et al., "Synthesis and characterization of colloidal dispersions of fluorescent, monodisperse silica spheres," *Langmuir* 1992, 8, 2921.

Wang et al., "Composite Photonic Crystals from Semiconductor Nanocrystal/Polyelectrolyte-Coated Colloidal Spheres," *Chem. Mater.* 2003, 15, 2724.

* cited by examiner

A. Energy Transfer

B. Refractive Index Mismatch

OPTICAL FEEDBACK STRUCTURES AND METHODS OF MAKING

CLAIM OF PRIORITY

This application claims priority to provisional U.S. Application No. 60/631,427, filed Nov. 30, 2004, which is incorporated by reference in its entirety.

FEDERALLY SPONSORED RESEARCH OR DEVELOPMENT

This invention was made with government support under Grant No. CHE-0209898, awarded by the National Science Foundation and Grant No. DE-FG02-02ER45974, awarded by the Department of Energy. The government has certain rights in the invention.

TECHNICAL FIELD

This invention relates to optical feedback structures.

BACKGROUND

Optical amplifiers utilize a gain medium to amplify optical radiation. In an amplifier, a source excites the gain medium to produce a population inversion between high and low energy states of the gain medium. The excited gain medium can amplify optical radiation at energies overlapping the energy differences between the high and low energy states of the population inversion because stimulated emission of radiation from the medium is more efficient than absorption of light. In general, a laser utilizes a cavity to supply feedback to an excited gain medium to cause amplified spontaneous emission. A laser cavity can include a series of optical components, such as mirrors, arranged relative to the gain medium to reflect radiation back into the cavity and thereby provide feedback.

SUMMARY

In general, a chromophore can be incorporated into a matrix to make structures that provide optical feedback. Advantageously, the structures provide feedback at an emission wavelength of the chromophore. The coupling between the emission of the chromophore and the optical feedback of the structure can give rise to laser emission. The feedback can arise from whispering gallery modes of a microsphere. The chromophore can be dispersed in a matrix adjacent to the microsphere. The whispering gallery modes can match an emission wavelength of the chromophore. A distributed feedback grating (DFB) can be made from the chromophore-matrix material. The periodicity of the grating can be selected to provide optical feedback at a emission wavelength of the chromophore.

Advantageously, the matrix-chromophore composite can protect the chromophore from degradation. The composite itself can be mechanically and chemically robust. Because the composite can be formed by polymerization from a liquid mixture, it can applied in a layer or film that conforms to the shape of a surface. The structure can provide optical gain or lasing that is chemically stable and photostable.

A facile method of incorporating semiconductor nanocrystals onto the surface of monodisperse micron-sized microspheres by depositing a nanocrystal composite onto the microsphere substrate, producing hundreds of uniform spherical resonators in a single spin-coating process. Stable room temperature whispering gallery mode (WGM) lasing was observed when individual microspheres were optically pumped.

A composite can be applied within a microfluidic device. The composite is preferably robust to exposure to polar solvents (e.g., water and short chain alcohols) and non-polar solvents (e.g., hexane), and incorporates a chromophore at a sufficient volume fraction to achieve optical gain. The composite can be coupled to a microcavity to facilitate lasing in the presence of polar solvents.

In one aspect, an optical resonator includes a microsphere disposed on a substrate and a composite disposed over the microsphere and the substrate, the composite including a matrix and a chromophore. The optical feedback structure can have a dimension of less than 1 mm. The composite can be adjacent to an outer surface of the microsphere. The composite can substantially coat an outer surface of the microsphere.

In another aspect, an optical resonator includes a substrate and a composite including a matrix and a chromophore disposed on the substrate. The composite forms a grating having a periodicity selected to provide optical feedback to the chromophore.

The chromophore can be a semiconductor nanocrystal. The matrix can include silica, titania, or a mixture thereof. The optical resonator can include a fluid flow path in fluid communication with the optical resonator.

In another aspect, a laser includes a microsphere disposed on a substrate, and a composite disposed over the microsphere and the substrate, the composite including a matrix and a chromophore. The laser includes an excitation source configured to excite the chromophore. The excitation source can be a light source.

In another aspect, a laser includes a substrate and a composite including a matrix and a chromophore disposed on the substrate. The composite forms a grating having a periodicity selected to provide optical feedback to the chromophore. The laser also includes an excitation source configured to excite the chromophore.

In another aspect, a method of making an optical resonator includes arranging a microsphere on a substrate, and depositing a composite including a matrix and a chromophore over the microsphere. The semiconductor nanocrystal can include a ligand having an affinity for the matrix. Depositing the layer can include depositing a mixture including the matrix, the chromophore, and the microsphere on the substrate. Depositing the mixture can include spin-casting the mixture.

In another aspect, a method of making an optical resonator includes depositing a composite including a matrix and a chromophore on a substrate, and shaping the composite to form a grating having a periodicity selected to provide optical feedback to the chromophore. Shaping the composite can include contacting the composite with a patterned stamp.

In another aspect, a method of generating light includes providing an optical resonator including a microsphere disposed on a substrate and a composite disposed over the microsphere and the substrate, the composite including a matrix and a chromophore, and exciting the chromophore.

In another aspect, a method of generating light includes providing an optical resonator including a substrate and a composite including a matrix and a chromophore disposed on the substrate, where the composite forms a grating having a periodicity selected to provide optical feedback to the chromophore, and exciting the chromophore.

In another aspect, a method of detecting a material includes exposing an optical resonator to the material, where the optical resonator includes a microsphere disposed on a substrate and a composite disposed over the microsphere and the substrate, the composite including a matrix and a chromophore, and observing an emission from the optical resonator. The material can quench fluorescence. The resonator can further include a receptor having an affinity for the material.

In another aspect, a sensor includes an optical resonator including a microsphere disposed on a substrate and a composite disposed over the microsphere and the substrate, the composite including a matrix and a chromophore. The resonator can further include a receptor having an affinity for a material.

In another aspect, a microfluidic device includes a flow channel in optical communication with an optical resonator including an optical feedback structure disposed on a substrate, and a composite including a matrix including a chromophore. The composite is disposed on the substrate and is in optical communication with the optical feedback structure The details of one or more embodiments are set forth in the accompanying drawings and the description below. Other features, objects, and advantages will be apparent from the description and drawings, and from the claims.

DETAILED DESCRIPTION

Figure 1A:
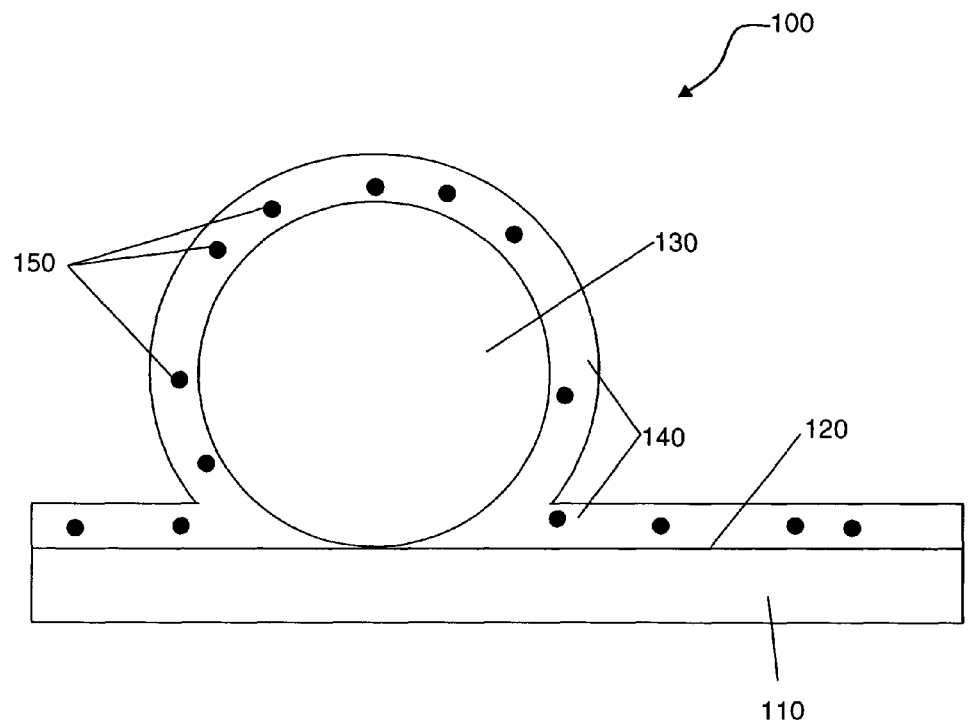
FIG. 1A is a schematic depiction of a structure including an microsphere.

Amplifiers and lasers include gain media for amplifying radiation or producing radiation by lasing. The gain medium can include a chromophore with absorption and emission wavelengths. The chromophore can be illuminated with a light source at an absorption wavelength to cause an emission at an emission wavelength. For semiconductor nanocrystal chromophores, the emission has a frequency that corresponds to the effective band gap of the quantum confined semiconductor material. The effective band gap is a function of the size and material of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The chromophore can be incorporated into a matrix. The matrix can be polymeric. For example, a plurality of nanocrystals can be incorporated in a matrix to form a composite. The matrix can be an inorganic matrix. The inorganic matrix can be a metal oxide matrix prepared, for example, by sol-gel processing, or other low temperature matrix-forming methods. A description of nanocrystal-containing composites and methods of making them can be found in, for example, U.S. Patent Application Publication Nos. 2003/0142944, and 2004/0004982, each of which is incorporated by reference in its entirety.

The synthesis of nanocrystals and the preparation of the matrix can be decoupled. High quality nanocrystals with a narrow size distribution and high fluorescence efficiency can be first prepared using published procedures. See, for example, C. B. Murray et al., *J. Amer. Chem. Soc.* 1993, 115, 8706, B. O. Dabbousi et al., *J. Phys. Chem. B* 1997, 101, 9463, each of which is incorporated by reference in its entirety. Subsequently, the organic, surface-passivating ligands on a surface of the nanocrystal can be substituted with other ligands. The other ligands can be chosen to stabilize the nanocrystals in polar solvents, such as ethanol, and to provide a tether for incorporating the nanocrystals into a matrix.

The matrix can be a metal oxide matrix, such as a silica or titania matrix. Formation of a titania matrix using a titanium (IV) alkoxide precursor exposed controllably to moisture (see, A. Imhof et al., *Nature* 1997, 389, 948, incorporated by reference in its entirety) obviates the use of acid catalysts that can be detrimental to the optical properties of the nanocrystals. Thermal annealing can complete the composite preparation. In this process, the gelation time under an inert atmosphere can be important, as incomplete incorporation of the nanocrystals into the matrix can lead to microscale phase separation of the nanocrystals from the titania matrix and the formation of optically scattering films.

Semiconductor nanocrystals with narrow size distributions and high luminescent efficiencies are an attractive alternative to organic molecules in applications such as optoelectronic devices and biological fluorescence labeling. See, for example, V. L. Colvin, et al., *Nature* 1994, 370, 354; B. O. Dabbousi, et al., *Appl. Phys. Lett.* 1995, 66, 1316; M. Bruchez Jr., et al., *Science* 1998, 281, 2013; W. C. W. Chan, and S. Nie, *Science* 1998, 281, 2016; and H. Mattoussi, et al., *J. Am. Chem. Soc.* 2000, 122, 12142, each of which is incorporated by reference in its entirety. Semiconductor nanocrystals can be more stable to photobleaching and have a more saturated fluorescence (i.e., narrower emission bandwidths) compared to organic molecules. Their optical properties are size-tunable and independent of their chemical properties.

Semiconductor nanocrystals are useful as chromophores for lasing media (see, for example, H.-J. Eisler, et al. *Appl. Phys. Lett.* 2002, 80, 4614; V. C. Sundar, et al. *Adv. Mater.* 2002, 14, 739; and V. I. Klimov, et al., *Science* 2000, 290, 314, each of which is incorporated by reference in its entirety). Numerous studies have been micron-sized cavities undertaken on coupled to nanocrystal-dielectric materials to investigate a variety of optical phenomena, from enhanced spontaneous emission to lasing. See, for example, M. A. Petruska, et al., *Adv. Mater.* 2003, 15, 610; M. V. Artemyev, and U. Woggon, *App. Phys. Lett.* 2000, 76, 1353; M. V. Artemyev, et al., *Nano Lett.* 2001, 1, 309; J. N. Cha, et al., *Nano Lett.* 2003, 3, 907; V. I. Klimov and M. G. Bawendi, *MRS Bull.* 2001, 26, 998; X. Fan, et al., *Phys. Rev. B.* 2001, 64, 115310; Y. P. Rakovich, et al., *Semicond. Sci. Technol.* 2003, 18, 914; and M. Kazes, et al., *Adv. Mater.* 2002, 14, 317, each of which is incorporated by reference in its entirety.

Circular optical cavities can have whispering gallery modes, which result from total internal reflection of light at the dielectric interface along the circumference of a circular or spherical cavity. See, for example, A. N. Oraevsky, *Quantum. Electron.* 2002, 32, 377, which is incorporated by reference in its entirety. The Q factor of these modes can be extremely high ($>10^8$) because of the strong confinement of photons within the modal volume. Spherical microcavities can therefore be desirable resonators for laser devices. See, for example, D. K. Armani, et al., *Nature* 2003, 421, 925; S. M. Spillane, et al., *Nature* 2002, 415, 621; and C. G. B. Garrett, et al., *Phys. Rev.,* 1961, 124, 1807, each of which is incorporated by reference in its entirety. However, it can be difficult to incorporate a gain material within the resonant modal volume of an optical microcavity. In this respect, colloidal semiconductor nanocrystals can be particularly desirable for use as a gain material, as they can be chemically functionalized to give the nanocrystals affinity for a microcavity, such as a silica or polystyrene microsphere. Appropriately functionalized nanocrystals can be incorporated into a sol, which imparts additional mechanical and chemical stability over devices fabricated using close packed nanocrystals films. See, for example, V. C. Sundar, et al., *Adv. Mater.* 2002, 14, 739; V. I. Klimov, et al., *Science* 2000, 290, 314; and A. V. Malko, et al., *App. Phys. Lett,* 2002, 81, 1303; each of which is incorporated by reference in its entirety.

Fluorescent semiconductor nanocrystals have been introduced into microspheres by either synthesizing the nanocrystals in situ using the microsphere as a host matrix, or using mercaptosiloxane functionalized nanocrystals as "seeds" for growing microspheres. See, for example, Y. Lin, et al. *Appl. Phys Lett.* 2002, 81, 3134; N. A. Dhas, et al. *Chem. Mater.* 1999, 11, 806; M. A. Correa-Duarte, et al., Chem. Phys. Lett. 1998, 286, 497; A. L. Rogach, et al., *Chem. Mater.* 2000, 12, 2676; and J. N. Cha, et al., *Nano Lett.* 2003, 3, 907, each of which is incorporated by reference in its entirety. These methods, however, produced either relatively low quality nanocrystals or microspheres of significant polydispersity. Significantly broadened and deep trap emission can also result from the silication process. Relatively monodisperse mesoporous polystyrene and silica microspheres were impregnated with high quality CdSe/ZnS core-shell nanocrystals (see, for example, X. Gao, S. Nie, *Anal. Chem.* 2004, 76, 2406; and X. Gao, S. Nie, *J. Phys. Chem. B* 2003, 107, 11575, each of which is incorporated by reference in its entirety). In the case of polystyrene, this was achieved through hydrophobic interactions between polystyrene and the hydrophobic ligands on the nanocrystal surface. For silica the method was similar, except the surface pores of the silica microspheres were first coated with small hydrophobic molecules. Because the nanocrystals were not chemically bound to the internal surface of the sphere, exposure to non-polar solvents caused the nanocrystals to leach out. For optical gain and laser media, chemically stable, monodisperse microspheres are desirable.

Microspheres containing chromophores have been utilized in an extensive variety of applications, including photonic crystals, biological labeling, and flow visualization in microfluidic channels. See, for example, Y. Lin, et al., *Appl. Phys Lett.* 2002, 81, 3134; D. Wang, et al., *Chem. Mater.* 2003, 15, 2724; X. Gao, et al., *J. Biomed. Opt.* 2002, 7, 532; M. Han, et al., *Nature Biotechnology.* 2001, 19, 631; V. M. Pai, et al., *Mag. & Magnetic Mater.* 1999, 194, 262, each of which is incorporated by reference in its entirety. Both the photostability of the chromophores and the monodispersity of the microspheres can be important. Nanoparticles, such as, for example, metal nanoparticles, metal oxide nanoparticles, or semiconductor nanocrystals can be incorporated into microspheres. For example, the high photostability, good fluorescence efficiency and wide emission tunability of colloidally synthesized semiconductor nanocrystals can make them an excellent choice of chromophore. Unlike organic dyes that emit at different wavelengths (which must be excited at different wavelengths), nanocrystals that emit different wavelengths can be excited simultaneously with a single wavelength. The nanocrystals can be more stable to frequent or prolonged exposure to light than organic chromophores. Colloidally synthesized semiconductor nanocrystals (such as, for example, core-shell CdSe/ZnS and CdS/ZnS nanocrystals) can be incorporated into microspheres. The microspheres can be, for example, silica microspheres or polystyrene microspheres. The microspheres can be members of a monodisperse population of microspheres.

The nanoparticle can be a chromophore. The nanoparticle can be a metal nanoparticle, a metal oxide nanoparticle, or a semiconductor nanocrystal.

The metal nanoparticle or metal oxide nanoparticle can have a dimension of less than 100 nanometers. The metal of the metal nanoparticle or the metal oxide nanoparticle can include titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, scandium, yttrium, lanthanum, a lanthanide series or actinide series element (e.g., cerium, praseodymium, neodymium, promethium, samarium, europium, gadolinium, terbium, dysprosium, holmium, erbium, thulium, ytterbium, lutetium, thorium, protactinium, and uranium), boron, aluminum, gallium, indium, thallium, silicon, germanium, tin, lead, antimony, bismuth, polonium, magnesium, calcium, strontium, and barium. In certain embodiments, the metal can be iron, ruthenium, cobalt, rhodium, nickel, palladium, platinum, silver, gold, cerium or samarium. The metal oxide can be an oxide of any of these materials or combination of materials. For example, the metal can be gold, or the metal oxide can be an iron oxide (e.g., $Fe_2O_3$, $Fe_3O_4$), a cobalt oxide (e.g., CoO), a zinc oxide (e.g., ZnO), a cerium oxide (e.g., $CeO_2$), or a titanium oxide (e.g., $TiO_2$). Preparation of metal and metal oxide nanoparticles is described, for example, in U.S. Pat. Nos. 5,897,945 and 6,759,199, each of which is incorporated by reference in its entirety.

The method of manufacturing a nanocrystal is a colloidal growth process. See, for example, U.S. Pat. Nos. 6,322,901 and 6,576,291, each of which is incorporated by reference in its entirety. Colloidal growth occurs by rapidly injecting an M-containing compound and an X donor into a hot coordinating solvent. The coordinating solvent can include an amine. The M-containing compound can be a metal, an M-containing salt, or an M-containing organometallic compound. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M-containing compound or X donor, the growth period can be shortened.

The M-containing salt can be a non-organometallic compound, e.g., a compound free of metal-carbon bonds. M is cadmium, zinc, magnesium, mercury, aluminum, gallium, indium, thallium, or lead. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, oxide, or carbonate salts are stable in air and allow nanocrystals to be manufactured under less rigorous conditions than corresponding metal alkyls.

Suitable M-containing salts include cadmium acetylacetonate, cadmium iodide, cadmium bromide, cadmium chloride, cadmium hydroxide, cadmium carbonate, cadmium acetate, cadmium oxide, zinc acetylacetonate, zinc iodide, zinc bromide, zinc chloride, zinc hydroxide, zinc carbonate, zinc acetate, zinc oxide, magnesium acetylacetonate, magnesium iodide, magnesium bromide, magnesium chloride, magnesium hydroxide, magnesium carbonate, magnesium acetate, magnesium oxide, mercury acetylacetonate, mercury iodide, mercury bromide, mercury chloride, mercury hydroxide, mercury carbonate, mercury acetate, aluminum acetylacetonate, aluminum iodide, aluminum bromide, aluminum chloride, aluminum hydroxide, aluminum carbonate, aluminum acetate, gallium acetylacetonate, gallium iodide, gallium bromide, gallium chloride, gallium hydroxide, gallium carbonate, gallium acetate, indium acetylacetonate, indium iodide, indium bromide, indium chloride, indium hydroxide, indium carbonate, indium acetate, thallium acetylacetonate, thallium iodide, thallium bromide, thallium chloride, thallium hydroxide, thallium carbonate, or thallium acetate.

Alkyl is a branched or unbranched saturated hydrocarbon group of 1 to 100 carbon atoms, preferably 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. Optionally, an alkyl can contain 1 to 6 linkages selected from the group consisting of —O—, —S—, -M- and —NR— where R is hydrogen, or $C_1$-$C_8$ alkyl or lower alkenyl.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids; however, other coordinating solvents, such as pyridines, furans, and amines may also be suitable for nanocrystal production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanocrystal obtained in the process. The 1,2-diol or aldehyde can be a $C_6$-$C_{20}$ 1,2-diol or a $C_6$-$C_{20}$ aldehyde. A suitable 1,2-diol is 1,2-hexadecanediol and a suitable aldehyde is dodecanal.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), sulfur, bis(trimethylsilyl)sulfide (($TMS)_2S$), a trialkyl phosphine sulfide such as (tri-n-octylphosphine) sulfide (TOPS), tris (dimethylamino) arsine, an ammonium salt such as an ammonium halide (e.g., $NH_4Cl$), tris(trimethylsilyl) phosphide (($TMS)_3P$), tris(trimethylsilyl) arsenide (($TMS)_3As$), or tris (trimethylsilyl) antimonide (($TMS)_3Sb$). In certain embodiments, the M donor and the X donor can be moieties within the same molecule.

The nanocrystal manufactured from an M-containing salt grows in a controlled manner when the coordinating solvent includes an amine. The amine in the coordinating solvent can contribute to the quality of the nanocrystal obtained from the M-containing salt and X donor. Preferably, the coordinating solvent is a mixture of the amine and an alkyl phosphine oxide in a mole ratio of between 1:99 and 99:1, between 10:90 and 90:10, between 30:70 and 70:30, or about 50:50. The combined solvent can decrease size dispersion and can improve photoluminescence quantum yield of the nanocrystal. The preferred amine is a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with tri-octylphosphine oxide (TOPO) include 1-hexadecylamine, or oleylamine. When the 1,2-diol or aldehyde and the amine are used in combination with the M-containing salt to form a population of nanocrystals, the photoluminescence quantum efficiency and the distribution of nanocrystal sizes are improved in comparison to nanocrystals manufactured without the 1,2-diol or aldehyde or the amine.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, both CdSe and CdS can be tuned in the visible region and InAs can be tuned in the infrared region.

A population of nanocrystals can have a narrow size distribution. The population can be monodisperse and can exhibit less than a 15% rms deviation in diameter of the nanocrystals, preferably less than 10%, more preferably less than 5%. Spectral emissions in a narrow range of between 10 and 100 nm full width at half max (FWHM) can be observed. Semiconductor nanocrystals can have emission quantum efficiencies of greater than 2%, 5%, 10%, 20%, 40%, 60%, 70%, or 80%.

The semiconductor forming the core of the nanocrystal can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, charge carriers, i.e., electrons and holes, are confined in the core of the nanocrystal when in an excited state. Alternatively, the conduction band or valence band of overcoating material can have an energy intermediate between the energies of the conduction and valence bands of the core material. In this case, one carrier can be confined to the core while the other is confined to the overcoating material when in an excited state. See, for example, U.S. Patent Application Publication No. 2004/0110002, which is incorporated by reference in its entirety. The core can have an overcoating on a surface of the core. The overcoating can be a semiconductor material having a composition different from the composition of the core, and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The outer surface of the nanocrystal can include a layer of compounds derived from the coordinating agent used during the growth process. The surface can be modified by repeated exposure to an excess of a competing coordinating group to form an overlayer. For example, a dispersion of the capped nanocrystal can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Monodentate alkyl phosphines (and phosphine oxides; the term phosphine below will refer to both) can passivate nanocrystals efficiently. When nanocrystals with conventional monodentate ligands are diluted or embedded in a non-passivating environment (i.e., one where no excess ligands are present), they tend to lose their high luminescence. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, tris(hydroxypropyl)phosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

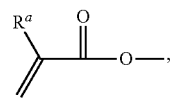

R' has the formula

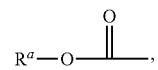

or R' is hydrogen, wherein $R^a$ is hydrogen or $C_1$-$C_4$ alkyl.

An overcoating process is described, for example, in U.S. Pat. No. 6,322,901, incorporated herein by reference in its entirety. By adjusting the temperature of the reaction mixture during overcoating and monitoring the absorption spectrum of the core, overcoated materials having high emission quantum efficiencies and narrow size distributions can be obtained. Alternatively, an overcoating can be formed by exposing a core nanocrystal having a first composition and first average diameter to a population of nanocrystals having a second composition and a second average diameter smaller than the first average diameter.

Size distribution during the growth stage of the reaction can be estimated by monitoring the absorption line widths of the particles. Modification of the reaction temperature in response to changes in the absorption spectrum of the particles allows the maintenance of a narrow particle size distribution during growth. Reactants can be added to the nucleation solution during crystal growth to grow larger crystals. By stopping growth at a particular nanocrystal average diameter, a population having an average nanocrystal diameter of less than 150 Å can be obtained. A population of nanocrystals can have an average diameter of 15 Å to 125 Å. The emission spectra of the nanocrystals can be tuned continuously over the wavelength range of 300 nm to 5 microns, or for example, when CdSe or CdTe is the core material, from 400 nm to 800 nm. IR-emitting semiconductor nanocrystals can be prepared according to methods described in, for example, U.S. Patent Application Publication No. 2004/0110002, which is incorporated by reference in its entirety.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum, if calibrated by a direct measurement of diameter, such as XRD or TEM.

A composite can include a plurality of nanoparticles dispersed in a matrix. The composite can have a high volume fraction of nanoparticles. The composite can be subsequently deposited onto the surface of a microsphere. For example, a composite of semiconductor nanocrystals and a sol can be prepared via a wet chemical method (see, for example, V. C. Sundar, H.-J Eisler, M. G. Bawendi, *Adv. Mater.* 2002, 14, 739; and U.S. Patent Application Publication Nos. 2003/0142944, 2004/0004982, and U.S. patent application Ser. No. 10/898,554, each of which is incorporated by reference in its entirety). The sol can be a metal oxide sol, such as, for example a titania sol or a silica sol. The composite can be mixed with microspheres and deposited (for example, by spin casting) onto a substrate (such as, for example, a glass substrate) and annealed at high temperature.

Referring to FIG. 1A, structure 100 includes substrate 110 having surface 120. Microsphere 130 can be disposed on surface 120. Layer 140 can be disposed over surface 120 and microsphere 130. Layer 140 can be a composite layer, including a matrix and material 150 dispersed in the matrix. Material 150 can be, for example, a chromophore or a nanoparticle. Nanoparticles can include a metal nanoparticle, for example, a gold nanoparticle, a magnetic nanoparticle, for example, a cobalt or iron oxide nanocrystal, or a semiconductor nanocrystal. Material 150 can include a semiconductor nanocrystal 160.

Figure 1B:
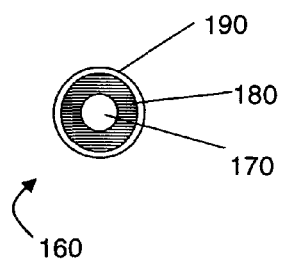
FIG. 1B is a schematic depiction of a cross-section of a semiconductor nanocrystal.

FIG. 1B shows a cross section of a semiconductor nanocrystal 160, including a core 170 and outer layer 190, and optionally including shell 180. Core 170 includes a first semiconductor material. Shell 180 can include a second semiconductor material. Outer layer 190 can include a ligand that has an affinity for a surface of semiconductor nanocrystal 160. The ligand can also be soluble in, compatible with, or reactive with a solvent, a matrix precursor, or a matrix.

A nanoparticle can include a ligand that provides solubility in a desired medium, such as a non-polar solvent, or a polar solvent, such as ethanol or water. The ligand can have one end that has affinity for the surface of nanoparticle, and another that is capable of reacting with a precursor to a matrix. The precursor can be a polymer precursor. The precursor can be, for example, a silica precursor, such as tetraethoxysilane, or a titania precursor, such as tetrabutylorthotitanate. The end of the ligand that reacts with the precursor can become incorporated in the matrix. In this way the nanoparticle can become anchored to the matrix. The ligand can become covalently bound to the matrix material.

Microsphere 130 can have a diameter of less than 1 millimeter, such as, for example, less than 500 micrometers, less than 100 micrometers, or less than 10 micrometers. For example, microsphere 130 can have a diameter between 1 micrometer and 100 micrometers. Microsphere 130 can be a member of a monodisperse population of particles. Microsphere 130 can be, for example a silica microsphere or a polystyrene microsphere. Microspheres incorporating fluorescent materials can be distinguished by the color (i.e. wavelength) of fluorescence emission, the intensity of the emission, or both. For example, two microspheres can incorporate materials that fluoresce at different wavelengths (i.e. the emission wavelengths can be distinguished); or can incorporate materials that fluoresce at the same wavelength but with distinguishable intensities. The fluorescence properties can be correlated with a size of microsphere, such that a population of microspheres having a narrow size distribution shares fluorescence wavelength (or wavelengths) and intensity (or intensities). When a size measurement is inconvenient or impractical, the fluorescence properties can be used to distinguish, identify or track microspheres of a particular size. See, for example, U.S. Pat. No. 6,617,583, which is incorporated by reference in its entirety.

Microspheres can be formed from a metal, ceramic, or polymer. The microsphere can include an inorganic material or an inorganic material. Some examples of microsphere materials are silica, titania, poly(divinylbenzene), poly(styrene), and poly(methylmethacrylate). A coating can be grown on a surface of a microsphere. For example, the coating can include silica or titania. A nanoparticle, such as a semiconductor nanocrystal, can be incorporated in the coating.

A layer including a matrix can be deposited over a microsphere. The layer can include a chromophore or nanoparticle. The nanoparticle can be derivatized to be compatible with or linked to the matrix. See, for example, A. van Blaaderen, and A. Vrij, *Langmuir* 1992, 8, 2921, which is incorporated by reference in its entirety. The matrix can include, for example, titania or silica. Silica microspheres can be synthesized using established techniques (see, for example, G. H. Bogush, et al., *J. Non-Cryst. Solids* 1988, 104, 95; and W. Stöber, et al., *J. Colloid Interface Sci.,* 1968, 26, 62, each of which is incorporated by reference in its entirety).

A texture can be applied to a layer including a matrix. The texture can be a pattern of elevations and depression. The texture can be applied by embossing the layer with a textured stamp. The textured stamp can be prepared, for example, by forming an elastomer (e.g., polydimethylsiloxane) on a patterned silicon surface. See, for example, Sundar, V. C., et al., *Adv. Mater.* 2004, 16, 2137; and U.S. Pat. Nos. 5,512,131; 6,180,239; and 6,518,168, each of which is incorporated by reference in its entirety. The textured surface of the stamp is contacted with the layer and pressure applied, thereby transferring the pattern of elevations and depressions from the stamp to the layer. The pattern can be a grating, i.e. a periodic series of elevations and depression, where the periodicity is chosen to provide optical feedback at a selected wavelength.

The ligands on the nanocrystal can impart both ethanol solubility and chemical compatibility with the matrix. See, for example, U.S. patent application Ser. No. 10/898,554, which is incorporated by reference in its entirety. The ligands on the nanocrystal surface (for example, TOPO ligands) can be exchanged for a ligand which promotes ethanol solubility and a ligand which can react with matrix precursors. For example, the ligand can be an alkoxy silane having a nanocrystal-affinity moiety which includes a hydroxy, sulfhydryl, carboxy, disulfide, phosphine, phosphite, or amino group.

For example, TOPO can be exchanged for a mixture of 5-amino-1-pentanol (AP), which can promote ethanol solubility, and 3-aminopropyltrimethoxysilane (APS), which can react with a matrix precursor. Other ligands that promote ethanol solubility or matrix precursor reactivity can be used. The mixture can optionally include a matrix-reactive compound that has substantially no affinity for the nanocrystal, such as (triethoxysilyl)propylisocyanate (TSPI). Including TSPI can prevent aggregation of nanocrystals when dissolved in ethanol. TSPI can also be reactive enough to condense with APS without the need for acid catalysts, which can be detrimental to nanocrystal optical properties. The amino groups of AP and APS can bind to the nanocrystal surface. The hydroxyl group of AP can permit dispersion in ethanol while the alkoxysilane moiety of APS can allow the formation of siloxane bonds with the matrix precursor. The cap-exchanged nanocrystals can be dispersed in a mixture of ethanol and a matrix precursor (such as tetraethoxysilane, or titanium (IV) butoxide). The matrix precursor can be prepolymerized to form a sol including the nanocrystals. The sol can be mixed with microspheres and deposited on a substrate, for example by spin-coating the substrate. The layer including the matrix is thus formed over the substrate and the microspheres. The matrix can be further polymerized, for example by exposing it to an elevated temperature.

Because the nanocrystal-sol composite film can be substantially thinner than the dimensions of a microsphere (~120-175 nm film thickness as measured by ellipsometry, compared to >5 μm diameter), the microsphere surface is physically wetted by the nanocrystal-sol composite, and the shape of the spherical template is preserved in the final structure. Numerous microsphere structures can be produced on a single substrate. The number of structures can depend on the loading level of the microsphere template in the diluted composite.

EXAMPLES

Core/shell CdSe/CdZnS nanocrystals were synthesized using a modification of a previously reported method. See, for example, B. R. Fisher, et al., *J. Phys. Chem. B* 2004, 108, 143; and B. O. Dabbousi, et al., *J. Phys. Chem. B* 1997, 101, 9463, each of which is incorporated by reference in its entirety. A bath of 3.125 g of purified tri-octylphosphine oxide (TOPO), 2.875 g hexadecylamine, 0.4 g n-hexylphosphonic acid, and 1.7 mL tri-octylphosphine (TOP) was degassed at 140° C. for 1 hour. Larger CdSe core samples can be prepared by removing the phosphonic acid component. A precursor solution of 1 mmol cadmium 2,4-pentanedionate and 2.2 mmol 1,2-hexadecanediol in 3 mL TOP was degassed at 100° C. for 1 hour, followed by an addition of 2 mL of 1.5 M tri-octylphosphine selenide (prepared by mixing 11.84 g selenium shot in 100 mL TOP with stirring overnight) after cooling to room temperature. The precursor solution was then rapidly injected into the bath at 360° C. and maintained at ~280° C. until the desired emission wavelength was achieved (typically 600-650 nm). The core size distribution for overcoating was narrowed via size selective precipitation after annealing overnight in growth solution at 80° C. The cores were then dispersed in hexane and added to a degassed solution of 10 g distilled TOPO and 0.4 g n-hexylphosphonic acid. After removing the hexane under vacuum at 80° C., 8 mL of a TOP solution containing an 80%/20% molar percent ratio of diethylzinc to dimethylcadmium and a 3-fold excess hexamethyldisilathiane was added at approximately 1 drop/sec using an addition funnel at a bath temperature of 145° C. The sample was allowed to anneal in growth solution at 80° C. overnight. The quantum yield for core/shell particles prepared using this method can be as high as 46%.

The nanocrystal/microsphere composite resonators were prepared under inert atmospheric conditions via a typical procedure presented here. First, 50 mg of CdSe/CdZnS NCs were precipitated and redispersed 3× from a butanol/hexane solution using methanol to remove excess capping groups. Next, 67 mg of a 50% w/w 5-amino-1-pentanol/ethanol solution was added followed by 200 mg of ethanol. After mixing for several minutes, an additional portion of 8 mg tris-hydroxypropylphosphine was added followed by 120 mg of ethanol. The capped solution was rapidly heated to reflux temperature while stirring, and then cooled before the addition of 30 mg of titanium (IV) butoxide. The sample was then allowed to prepolymerize at 60° C. for 2 hours. After cooling the sample, the sol was diluted by a factor of 2 with anhydrous ethanol and filtered. Approximately 1 mg of microspheres was added per 200 μL of filtered sol which was then spin cast onto a microscope coverslip at 4000 rpm. The sample was then annealed at 200° C. for 2 minutes and allowed to cool under an inert atmosphere.

Nanocrystal-silica sols were prepared by dispersing 105 mg of CdSe/ZnS nanocrystals in 205 mg of a 50% by weight solution of AP in ethanol. An additional 286 mg of ethanol was added, affording a clear ethanol solution of nanocrystals. 10 mg of TSPI and 52 mg of APS were then added with stirring. The resulting viscous liquid was filtered and spin coated on a pre-cleaned glass substrate, giving a clear, smooth film. The thickness of the film was controlled by altering the spin coating speed. The film was then annealed on a hot plate at 150° C. for 2 minutes.

For nanocrystal-silica coated microspheres, a pre-polymerized sol was diluted with 2× the amount of ethanol and mixed with 20 μm diameter commercially available silica microspheres. The resultant mixture was spin coated at 4000 rpm on a glass substrate and then annealed on a hot plate at ~150° C. for 2 minutes.

Figure 2:
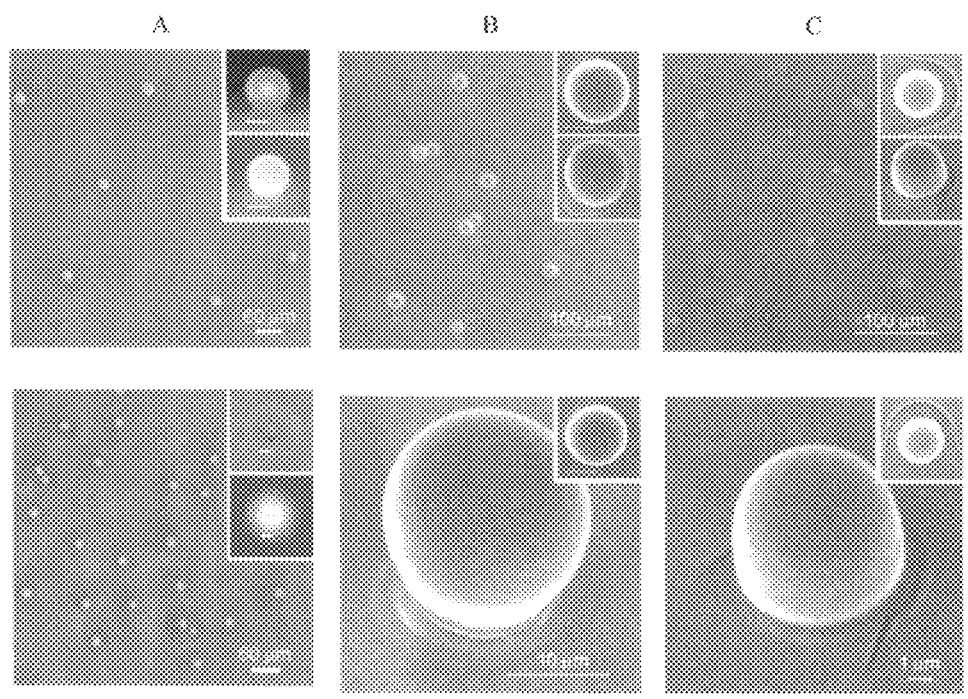
FIG. 2A shows fluorescence photographs and micrographs of optical resonators.
FIGS. 2B and 2C are scanning electron micrographs of optical resonators.

Optical and SEM images of several of microspheres coated with a nanocrystal-titania composite are shown in FIG. 2. FIG. 2A presents fluorescent optical images of 20 μm, 30 μm (top) and 6.85 μm (bottom) silica microspheres coated with a titania film that includes CdSe/CdZnS nanocrystals. The insets show the optical and fluorescent images of the microsphere composites. Top inset scale bar is 15 μm and bottom scale bar is 5 μm. FIGS. 2B and 2C are SEM micrographs of NC titania/20 μm (FIG. 2B) and 6.85 μm (FIG. 2C) silica core composite samples. Although the film occasionally cracked near the base of the structure, this did not prevent the observation of laser emission from the sample. The cracks in the base of the spheres provided a visual contrast that showed the evenness of the NC/titania coating on the microsphere template. The whispering gallery mode lasing was expected to occur along the circumference of the sphere parallel to the surface as the film near the base of the microsphere has been largely perturbed. It can be seen from FIG. 2 that the surface of the microsphere core was evenly coated with the nanocrystal-titania composite, allowing for the formation of a structure with the feedback of a spherical resonator (see, for example, H.-M. Tzeng, et al., *Opt. Lett.*, 1984, 9, 499, which is incorporated by reference in its entirety). Further, the dispersion in size of the microsphere structures was the same as the dispersion of the microspheres before coating.

The nanocrystal-sol microsphere composites were analyzed using a Nikon Eclipse ME600 for optical and fluorescence characterization. SEM micrographs were obtained using a JEOL 6320FV operating at 1.0 keV on 100 Å carbon coated samples. The spectroscopic ellipsometry measurements were made on samples spin coated on a silicon wafer using a Sopra GES 5 ellipsometer at 65°, 67° and 69° degrees of incidence. The laser spectroscopic measurements were made with a home built fluorescence microscope coupled to a modified SPEX 270M and a Princeton Instruments LN/CCD-512TKB1 camera. The spectral resolution was measured to be 1.1 nm. The excitation source was based upon a Coherent Mira 900 Ti:sapphire oscillator coupled to a BMI Alpha-1000 regenerative amplifier to generate 100 fs pulses of 400 nm light. The power of the beam was measured before the microscope objective. As a result, the threshold power for lasing in the microsphere composites was likely less than reported due to pump losses in the objective and at the air/glass/sol interface. The nanocrystal loading content in the titania films was determined according to methods described previously, for example in V. C. Sundar, et al., *Adv. Mater.* 2002, 14, 739, which is incorporated by reference in its entirety.

Figure 3:
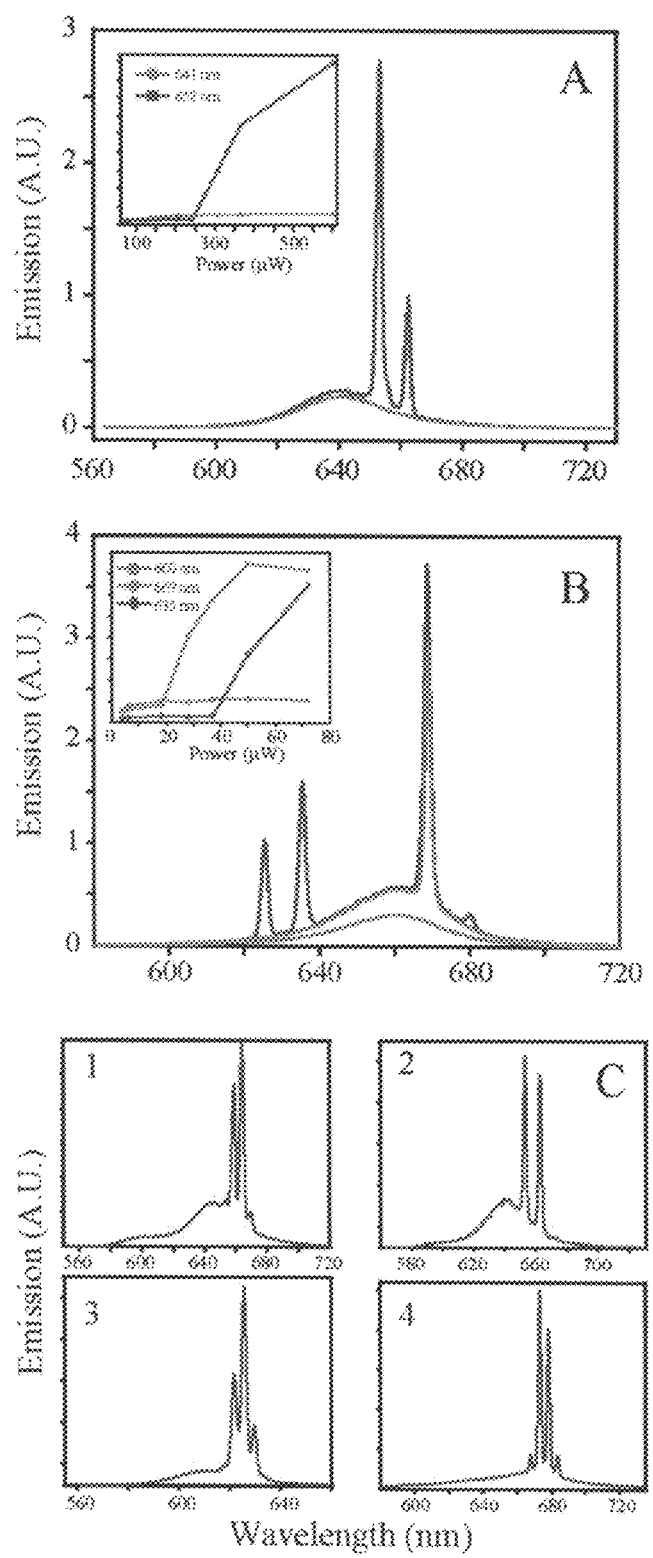
FIGS. 3A-3C are graphs showing spectra of optical resonators.

Laser emission from these structures was observed using a home-built imaging/dispersive fluorescence microscope coupled to a frequency doubled 1 kHz Ti:sapphire regeneratively amplified laser light source for pumping the devices. The excitation laser was coupled though the microscope objective which was also used to collect the emission from the sample. Shown in FIG. 3 are the spectra of several individual nanocrystal/WGM resonator composites derived from a variety of different CdSe/CdZnS nanocrystal samples and microsphere templates. FIG. 3A shows spectra of a single 7 µm Bangs labs core microsphere below (205 µW) and above (366 µW) laser threshold. The inset shows the power dependent intensity of the fluorescence at 641 nm and the laser emission at 652 nm. Close inspection of the spectra revealed WGM mode structure coupled to the free fluorescence at low intensity excitation. FIG. 3B shows spectra of a single 5.6 µm hollow glass Aldrich core microsphere below and above laser threshold. At low pump intensities single mode biexcitonic emission was observed, while at higher intensities simultaneous biexcitonic and multiexcitonic laser emission is seen. The inset shows the threshold behavior of the biexcitonic and multiexcitonic lasing. FIG. 3C shows more examples of saturated laser emission using a variety of nanocrystal samples and microsphere templates: (1) 25 µm polystyrene, (2) 6.85 µm silica, (3) and (4) 20 µm silica with different wavelength emitting CdSe/CdZnS nanocrystals as the gain material. The spectra reveal clear threshold behavior of lasing only on the low-energy side of the nanocrystal fluorescence, consistent with the red-shifted gain profiles as observed in previous reports. Single mode lasing has been observed by tuning the nanocrystal fluorescence emission wavelength and the diameter of the template microspheres, as seen in the single biexcitonic emission spectrum (green line) in FIG. 3B. This results when a single WGM resonance overlaps with the narrow gain profile of the nanocrystal sample. At higher pump intensities a second set of laser emission lines were observed in the same sample, blue shifted with respect to the biexciton peaks, due to formation and gain from the optically allowed CdSe $1P_h$-$1P_e$ transition (red line in FIG. 3B). This recombination occurred at a higher energy than the $1S_h$-$1S_e$ transition that was responsible for biexcitonic lasing (see, for example, D. J. Norris, M. G. Bawendi, *Phys. Rev. B* 1996, 53, 16338, which is incorporated by reference in its entirety). These transitions may not be observed in smaller CdSe cores due to their short lifetimes (see, for example, J.-M. Caruge, Y. Chan, M. G. Bawendi, *Phys. Rev. B.* 2004, 70, 085316, which is incorporated by reference in its entirety).

Figure 4:
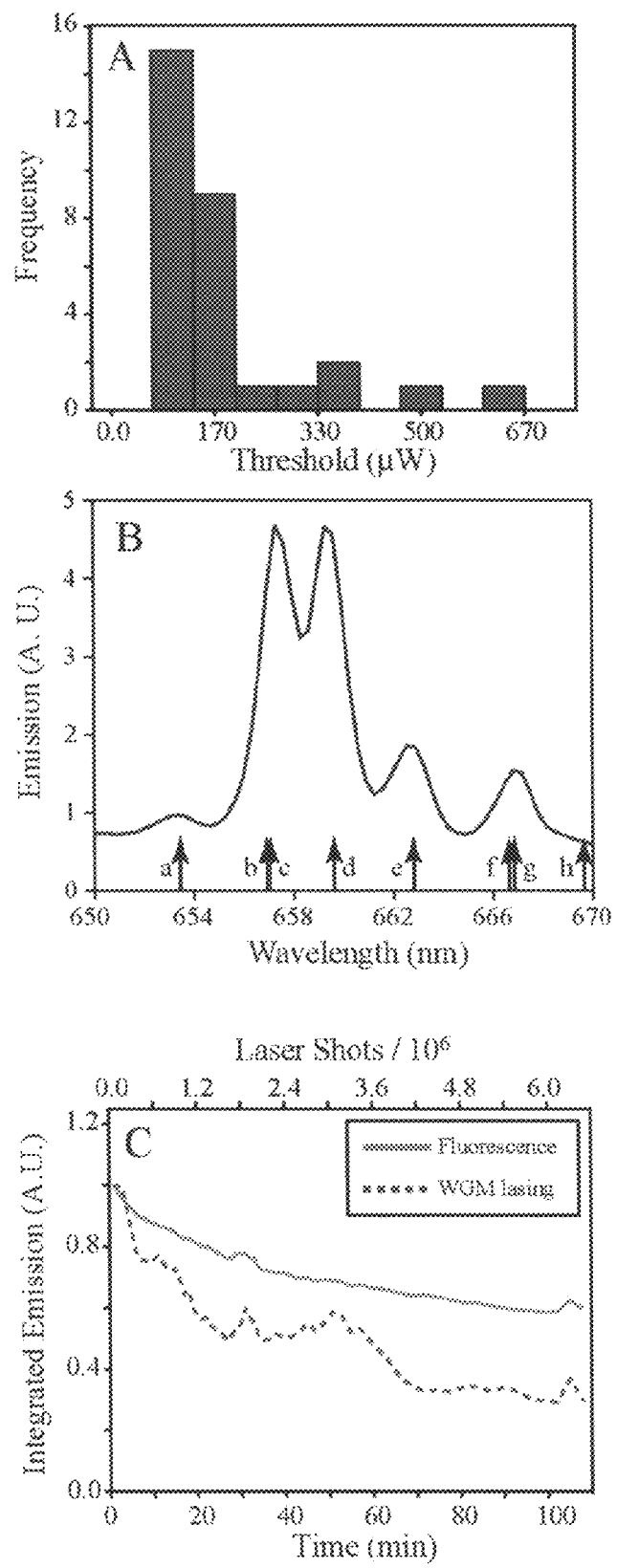
FIGS. 4A-4C are graphs showing properties of optical resonators.

FIG. 4A shows a histogram of the laser thresholds for 30 individual nanocrystal-microsphere lasers from a single sample. Thresholds as low as 12 µW have been observed for red emitting CdSe/CdZnS samples on 20 µm silica spheres. The mode frequencies observed in the lasing spectrum of a single microcavity were compared to Mie theory calculations for coated spheres in which the shell refractive index and sphere outer diameter were used as fitting parameters to match the experimental data (see, e.g., Bohren, C. F., Huffman, D. R. *Absorption and Scattering of Light by Small Particles*. Wiley, 1998, which is incorporated by reference in its entirety). See FIG. 4B, which shows the lasing spectrum of an individual ~7.5 micron microsphere. Arrows depict the calculated resonant cavity mode frequencies from Mie theory for a coated sphere. Mode frequencies are: a) $TM_{49}^2$ b) $TM_{60}^1$ c) $TE_{52}^2$ d) $TE_{61}^1$ e) $TM_{48}^2$ f) $TE_{51}^2$ g) $TM_{59}^1$ h) $TE_{60}^1$. Other high angular modes were outside of the gain spectrum while low angular modes in this window have weak Mie resonances. A good agreement between theory and experiment was obtained using reasonable parameters for the shell thickness and refractive index of the coating. The known refractive index of 1.37 of the 6.84 µm diameter core sphere was used without adjustment in Mie calculations for coated spheres. The best fit to the data was obtained with a shell refractive index of 1.846 and an outer sphere diameter of 7.746 µm. The fitted coating size was consistent with the experimentally measured diameter of 7.66±0.11 µm, as determined by SEM micrographs of similar samples, and the experimental results from spectroscopic ellipsometry which show that the index of refraction varies from 1.82 to 1.83 over the wavelength range of 600 to 700 nm. Note that the SEM results revealed that the sphere coating was thicker than the substrate film, perhaps due to the surface tension of the liquid sol surrounding the sphere core upon spin casting. Differences in the fitted and measured values for the refractive index were likely due to the dependence of the index on the volume fraction of CdSe in the matrix, which varies from sample to sample. This strongly suggested that the observed laser emission results from the higher Q factor WGM structure of the coated sphere. FIG. 4C shows time and shot dependent laser intensity of a single microsphere. The data were recorded with pulses of 100 fs duration illuminating the microsphere with 400 nm light at a frequency of 1 kHz.

A nanocrystal-silica sol can be resistant to wetting. To 50 mg CdSe/ZnS or CdS/ZnS nanoparticles, 79 mg of a 50% (by weight) solution of aminohexanol was added, followed by an addition of 222 mg of ethanol. Next, 30 mg of aminopropyltriethoxysilane were added. The solution was mixed and spin cast onto a clean glass substrate for 1 minute. The substrate was heated at 60° C. for 8 minutes and then the heat was ramped to 200° C., after which the substrate was removed from the heat source and allowed to cool. Nanocrystal-microsphere resonators made by this method can exhibit laser emission when submerged in water.

Figure 5:
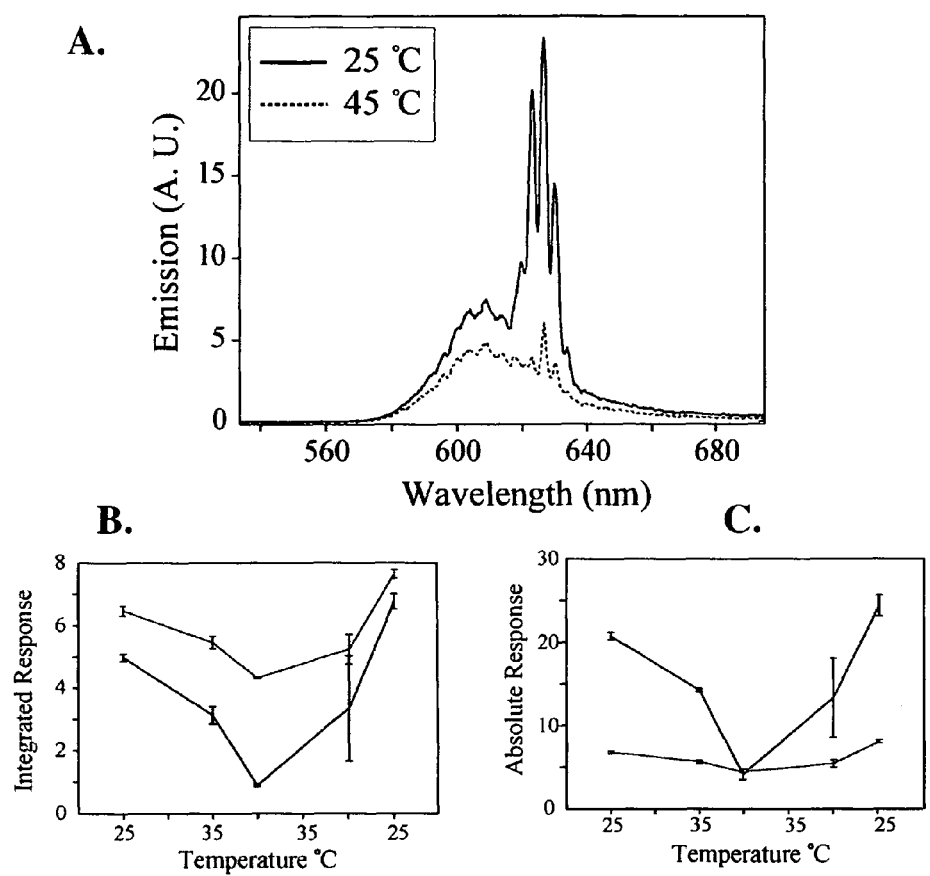
FIGS. 5A-5C are graphs showing temperature response of an optical resonator.

Non-linear sensing applications have also been realized. By monitoring the fluorescence and laser emission, the laser materials have a 10-fold non-linear increase in response to temperature. FIG. 5A shows spectra recorded at 25° C. and 45° C. FIGS. 5B and 5C show the temperature response of fluorescence (green) and laser emission (red) in terms of integrated response (FIG. 5B) and absolute response (FIG. 5C).

Figure 6:
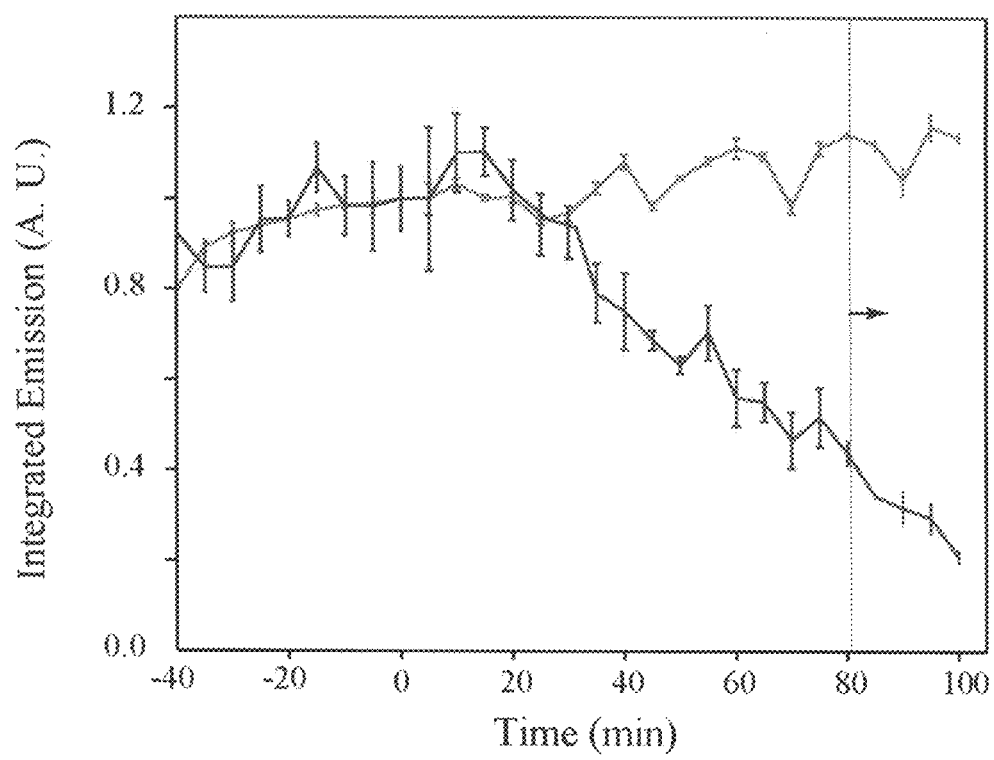
FIG. 6 is a graph showing the behavior of an optical resonator when exposed to a fluorescence quencher.

Chemical sensitivity of the structures was examined by exposing them to a fluorescent quenching agent. An 80-fold improvement in the non-linear response of the devices was observed. Specifically, the laser device was exposed to copper acetylacetonate, a fluorescence quencher. Referring to FIG. 6, before time=0, the device was exposed to ethanol only. The fluorescence (green) and laser emission (red) were stable. At t=0, a copper/ethanol solution was added. The laser emission was quickly quenched while the fluorescence did not change dramatically. This shows that the laser emission was non-linearly sensitive to the quencher. The line with the arrow marks the time at which the pump laser was turned on and left on. The quenching of the laser appeared to occur at the same rate, indicating that the material was not simply photobleaching, but that the loss of laser intensity was a chemical effect of the copper.

Figure 7:
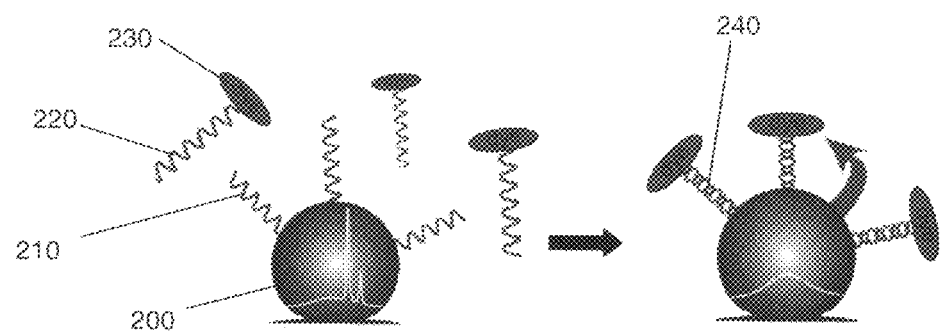
FIGS. 7A-7B are schematic depictions of optical resonators configured to detect a material.
Figure 7:
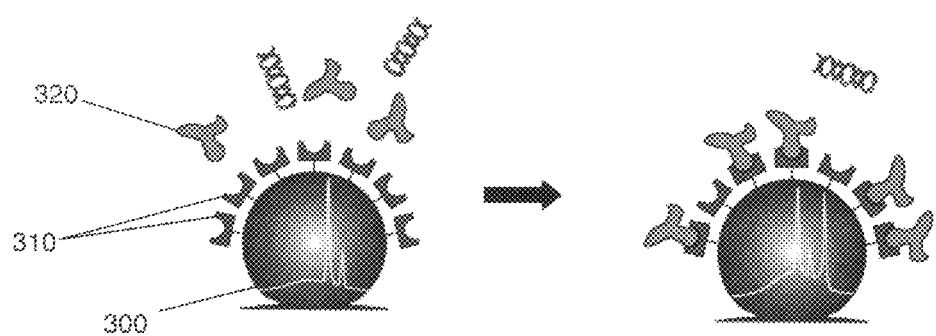

The optical resonators can be used sensing applications. Referring to FIG. 7A, an optical resonator 200 is provided. The exterior of the resonator is linked to oligonucleotide 210. Complementary oligonucleotide 220, with attached dye 230, can hybridize with oligonucleotide 210 to form double stranded complex 240. Double stranded complex 240 brings dye 230 in proximity to resonator 200. When resonator 200 is excited by light, it can undergo laser emission; however, if dye 230 is held in proximity by double stranded complex 240, energy transfer can occur, reducing the intensity of laser emission. In this way, the presence of oligonucleotide 220 can be detected as a change in the intensity of laser emission from resonator 200.

Referring to FIG. 7B, optical resonator 300 is linked to capture molecules 310. Capture molecules 310 can be, for example, an antibody or other molecule with a specific affinity for a binding partner. Resonator 300 is allowed to contact a sample including target molecule 320. Capture molecule 310 and target molecule 320 are binding partners; that is, they can specifically associate with one another. The sample can be a complex mixture, such as a cell homogenate or other biological specimen. When target molecules 320 associate with capture molecules 310 on the resonator, the effective refractive index of the material adjacent to the resonator is changed. This change in refractive index can alter the emission of the resonator in a detectable way. See, for example, U.S. Patent Application Publication No. 2004/0017834, which is incorporated by reference in its entirety. By observing the change in resonator emission, the presence of target molecule 320 in the sample can be detected.

The nanocrystal-sol-microsphere composites have advantages over previously reported microscopic material systems for laser applications. The semiconductor nanocrystals in a matrix maintained stable room temperature lasing over a much longer period of time than can organic dyes, which irreversibly photobleach. Further, the WGM resonant cavity structure can be introduced using a variety of commercially available microsphere templates, thus avoiding the difficult wet chemical incorporation of a chromophore into a microcavity. The many whispering gallery modes of a large microsphere can allow multiple wavelength laser emission to occur simultaneously, as was demonstrated. The method can also produces hundreds of resonators in a single spin-coating process. The ease of the method, the photostability of the nanocrystal/microsphere composites and the ability to produce large numbers of microsphere resonators at one time opens up avenues for applications in areas such as chemical and biological sensing. The surfaces of the composite structures can be directly chemically functionalized, further increasing the range of applications of these structures.

High quality CdS/ZnS core-shell nanocrystals that were chemically modified and incorporated into a sol-gel derived silica film exhibited room temperature ASE and lasing at blue wavelengths upon optical excitation. Because the ZnS shell efficiently passivates the surface of the CdS nanocrystals, deep trap emission was eliminated from the CdS/ZnS nanocrystal-silica composite. Exposure to air over the course of weeks did not result in any noticeable degradation of the film. The absence of deep trap emission, the robustness, and the high reproducibility of these nanocrystal-silica films permit their use in fundamental optical studies and in potential applications, as exemplified in this work by the demonstration of tunable room temperature ASE and lasing. The absence of deep trap emission from the films also facilitated variable stripe length (VSL) measurements of the modal gain, since observed intensities could be easily assigned to ASE transitions.

Variable stripe length measurements were subsequently performed at room temperature in order to determine the gain coefficient, as illustrated by the gain curve in FIG. 8B. The maximal gain in a composite film of 3.3 nm radius CdS/ZnS nanocrystals in silica was found to be ~100 cm$^{-1}$, on the same order as that of high quality CdSe nanocrystals in titania films. This gain resulted from the high loading fraction of nanocrystals into the sol-gel matrix, which was ~10%. Indeed, the high loading fraction accounted for the increased refractive index of the silica film (n ~1.7 as determined by ellipsometry), affording enough index contrast between the film and glass substrate for the film to serve as a waveguide.

Optically pumped lasing was achieved by coupling the CdS/ZnS nanocrystal-silica composite to a spherical resonator. Nanocrystal-silica coated spherical resonators were produced using blue emitting CdS/ZnS nanocrystals (see, for example, U.S. Patent Application Publication No. 2005/0258418, which is incorporated by reference in its entirety). A home-built imaging/dispersive far-field fluorescence microscope coupled to the frequency-doubled output of the Ti:Sapphire regenerative amplifier was used to excite and detect lasing from the microsphere-nanocrystal composites. Lasing was obtained at room temperature by exciting individual microspheres above threshold, as indicated in the spectra of FIG. 8A. The development of narrow (FWHM <1 nm), evenly-spaced peaks (characteristic of whispering gallery modes) within the gain spectrum of the nanocrystals depicts the onset of lasing. Clear threshold behavior is readily seen in FIG. 8B, which shows a superlinear increase in emission intensity at ~60 μW (corresponding to a flux density of ~3.7 mJ/cm$^2$). The insets show the emission spectra of the NC-microsphere composite below and above threshold. A resolution limited Q factor (where Q=λ/Δλ) of >600 was obtained from the spectra in FIG. 8A, which was reasonable considering radiative losses from self-absorption and surface defects in the cavity.

Figure 8:
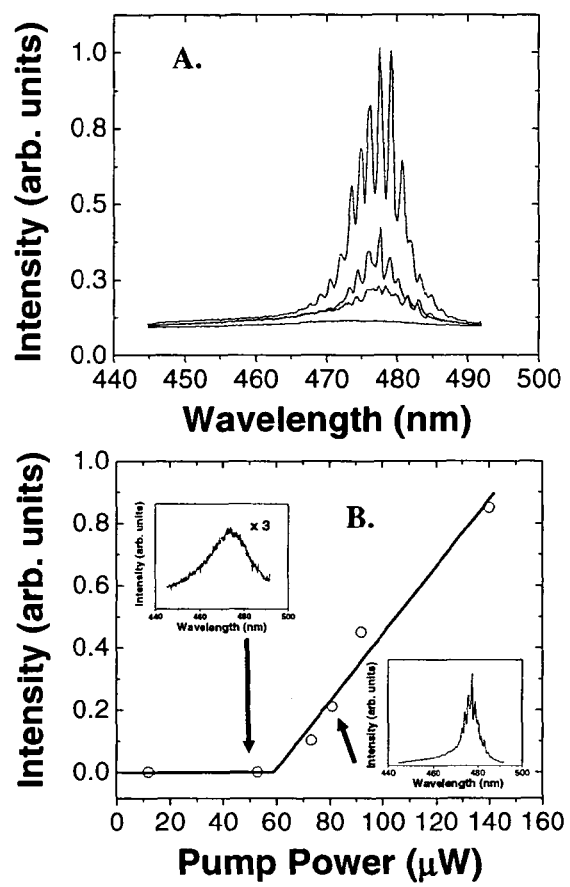
FIGS. 8A-8B are graphs depicting the properties of optical resonators.

FIG. 8B shows the integrated lasing intensity (after subtracting the contribution from background fluorescence) from FIG. 8A plotted at various pump powers shows clear threshold behavior. The insets of FIG. 8B on the left and right are the actual emission spectra of the data points indicated by the arrows.

Figure 9:
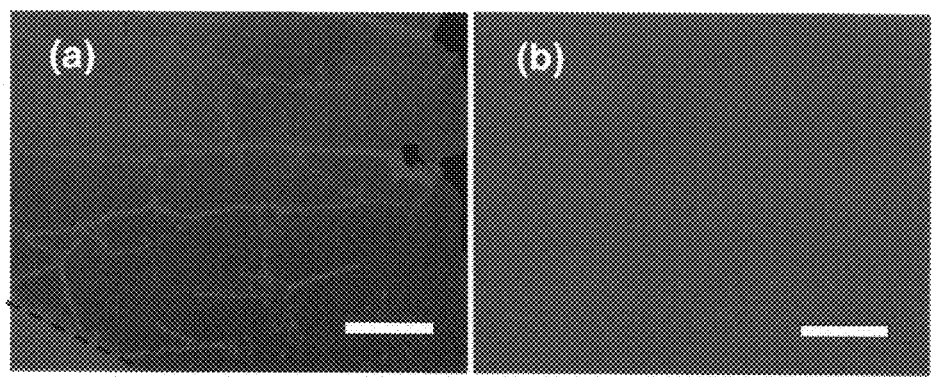
FIGS. 9A-9B are fluorescence micrographs of nanocrystal composite films.

Although the nanocrystal-titania sol composites are thermally stable under the illumination conditions required to achieve optical gain, exposure to water or short-chain alcohols resulted in rapid structural and photophysical degradation of the composite. FIG. 9A is a fluorescence micrograph that shows the extensive cracking that occurred in a nanocrystal-titania film upon exposure to water. The cracking was attributed to a dramatic syneresis of the titania matrix, which incorporated unreacted titanium t-butoxide moieties. Because the titania-based composites were not water-stable, they were unsuitable for use in a microfluidic device. Nanocrystal-silica sol composites, on the other hand, did not degrade when exposed to water. See FIG. 9B, which shows a fluorescence micrograph of a nanocrystal-silica film after exposure to water. The scale bars in FIGS. 9A and 9B are each 30 µm.

Figure 10A:
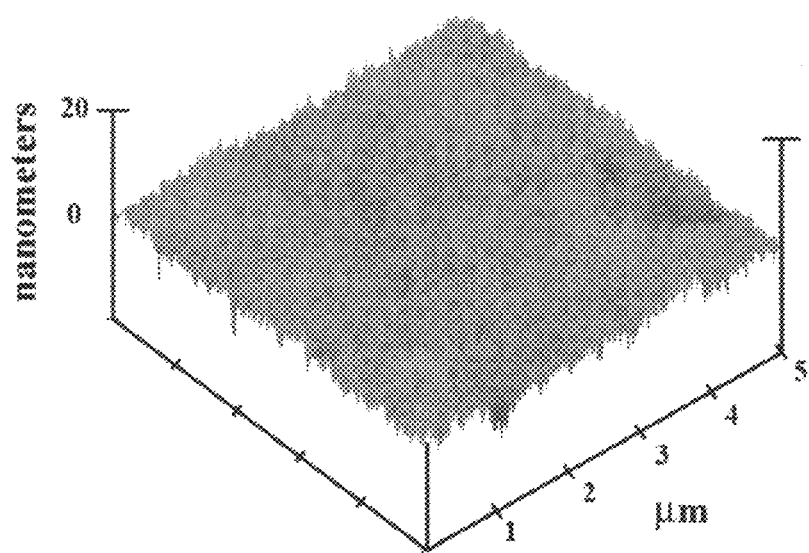
FIG. 10A is a graph depicting AFM measurements of a nanocrystal-silica composite film.
Figure 10B:
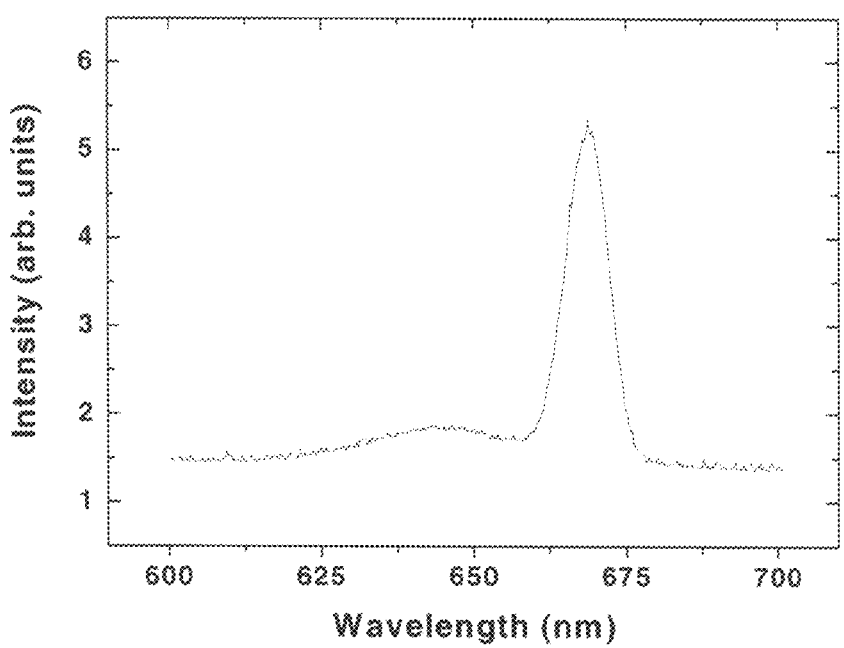
FIG. 10B is a graph depicting properties of the composite.

The nanocrystal-silica composites were smooth (rms roughness ~1.4 nm, see FIG. 10A) and incorporated a volume fraction of ~12% nanocrystals. These composites readily exhibited ASE under ambient conditions when excited with a frequency doubled Ti:sapphire laser, using a 60 fs pulse width repeating at 1 kHz. FIG. 10B shows a spectrum of ASE from a nanocrystal-silica film acting as a slabguide in air.

Figure 10C:
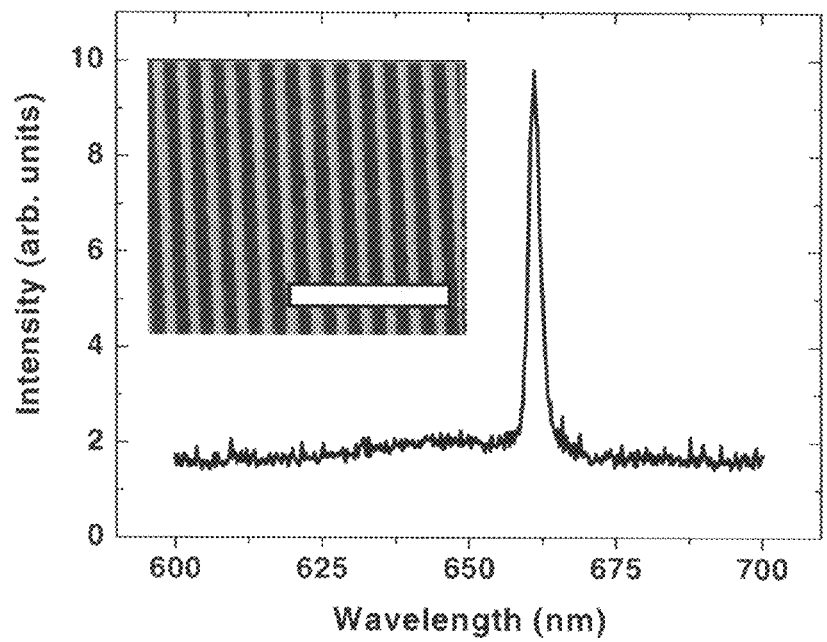
FIGS. 10C and 10D are graphs depicting the optical properties of the composite when coupled to an optical feedback structure.

The nanocrystal-silica composites were formed into DFB structures by taking a pre-polymerized nanocrystal-silica sol on a glass substrate and compressing it under a PDMS stamp bearing a grating pattern. The stamp was applied with a constant pressure of ~9.8 kN/m$^2$ and then annealed on a hot plate at ~150° C. for 2 minutes. The weight ratio of TSPI to APS was preferably 1:5 for good pattern transfer from stamp to film. FIG. 10C (inset) shows an AFM image of the 360 nm DFB grating, which shows the uniformity and modulation depth (~45 nm) achieved by the soft lithography method. The scale bar is 2.5 µm. The nanocrystal-silica composites achieved lasing even when submerged in water. FIG. 10C shows lasing from this DFB structure.

Figure 10D:
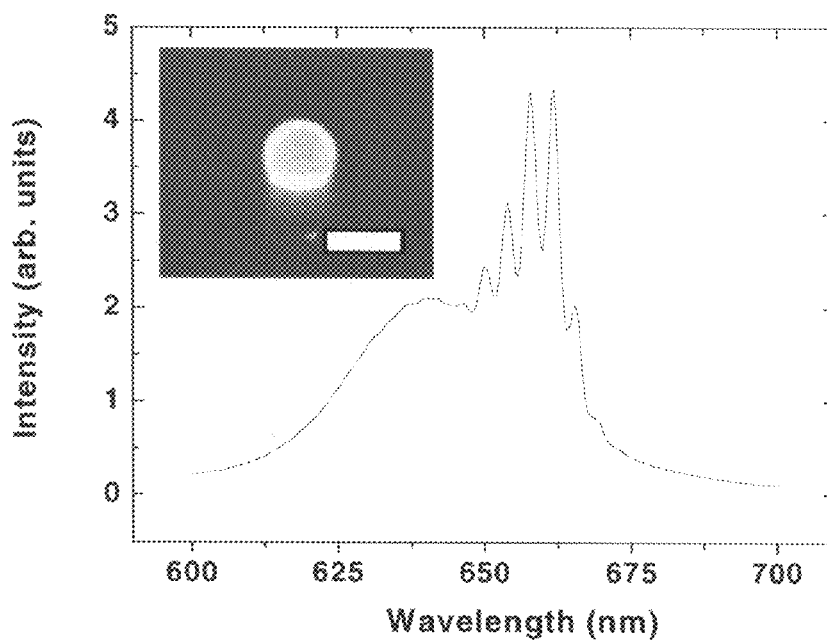

The nanocrystal-silica composites were also coupled to microsphere resonators. FIG. 10D shows the WGM lasing observed from such a structure in methanol. The inset is a fluorescence micrograph of the resonator (scale bar, 20 µm). Lasing from the composites in the presence of water and short-chain alcohols was stable over a period of hours (~10$^6$ laser shots).

Figure 11:
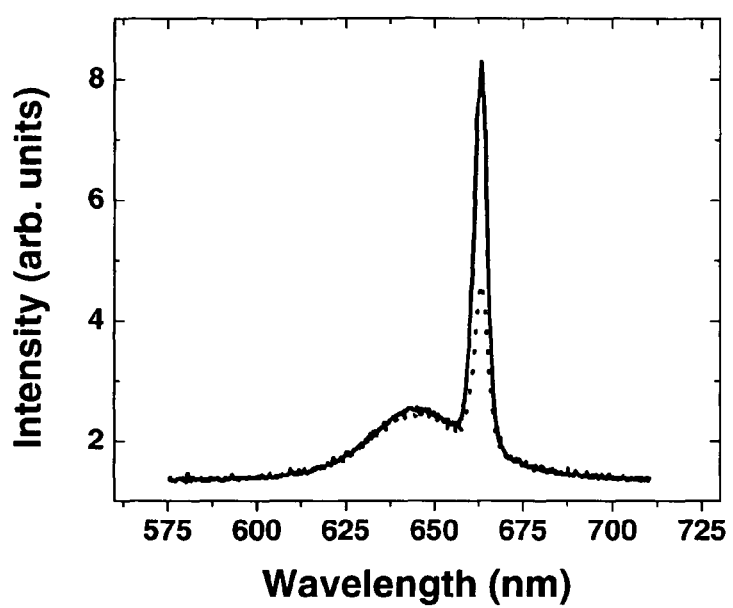
FIG. 11 is a graph depicting optical properties of a nanocrystal-silica composite film under different conditions.

The dynamic response of nanocrystal emission to their environment was demonstrated by observing the effect on lasing upon exposure of the nanocrystals to primary amines. FIG. 11 shows the photoluminescence intensity of a DFB nanocrystal-silica laser immersed in water before (dotted line) and after (solid line) exposure to 6-amino-1-hexanol. The excitation intensity, area of excitation and the detection angle were kept constant. A significant increase in the lasing intensity and as less dramatic increase in the fluorescence intensity were observed. Although amines are known to increase the single exciton quantum yield in CdSe nanocrystals, it was unclear whether they would affect optical gain, which results from biexcitons. See, for example, Klimov, V. I., et al., Science 2000, 290, 314, which is incorporated by reference in its entirety.

Figure 12A:
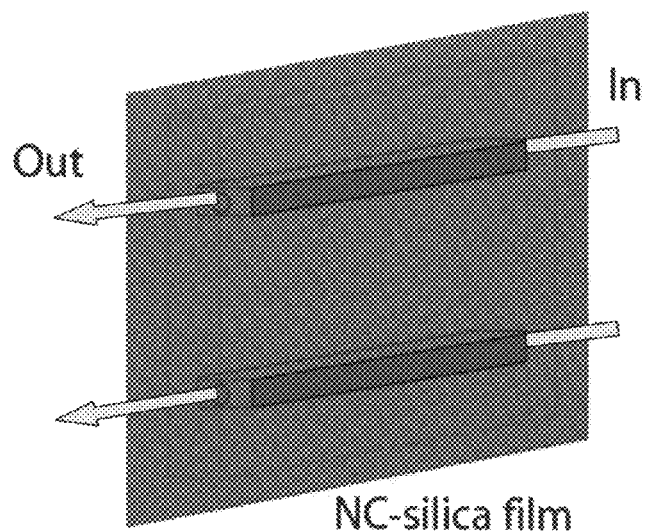
FIG. 12A is a schematic depiction of a device incorporating a nanocrystal-silica composite film.
Figure 12B:
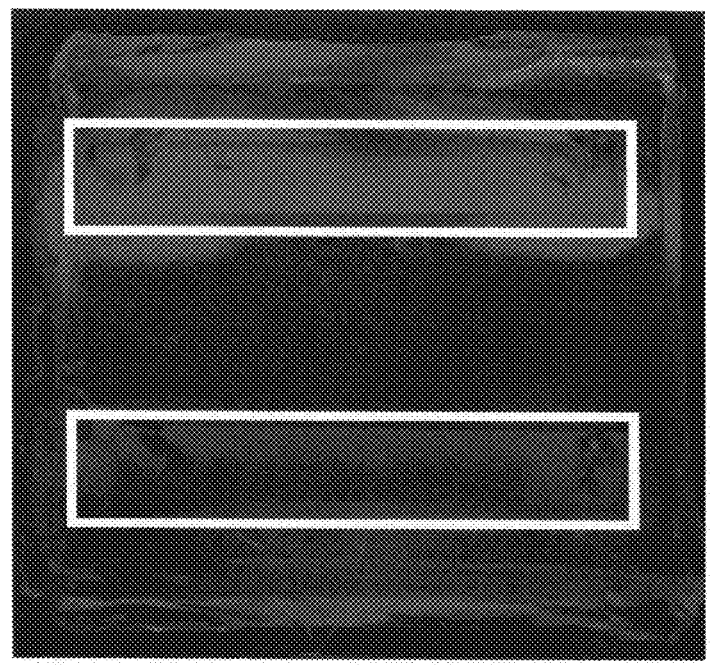
FIG. 12B is a photograph of the device in operation.

The nanocrystal-silica films were interfaced with a PDMS block containing two separate channels, each having an inlet and an outlet to provide for fluid flow, as illustrated in FIG. 12A. When 6-amino-1-hexanol (AH) was flowed into the film via the PDMS flow channel, a dramatic increase in the single exciton intensity was observed (FIG. 12B). FIG. 12B is a photograph taken under UV illumination, where the upper channel was exposed to a 0.1 M solution of AH in water, while the lower channel was exposed to pure water.

Figure 12C:
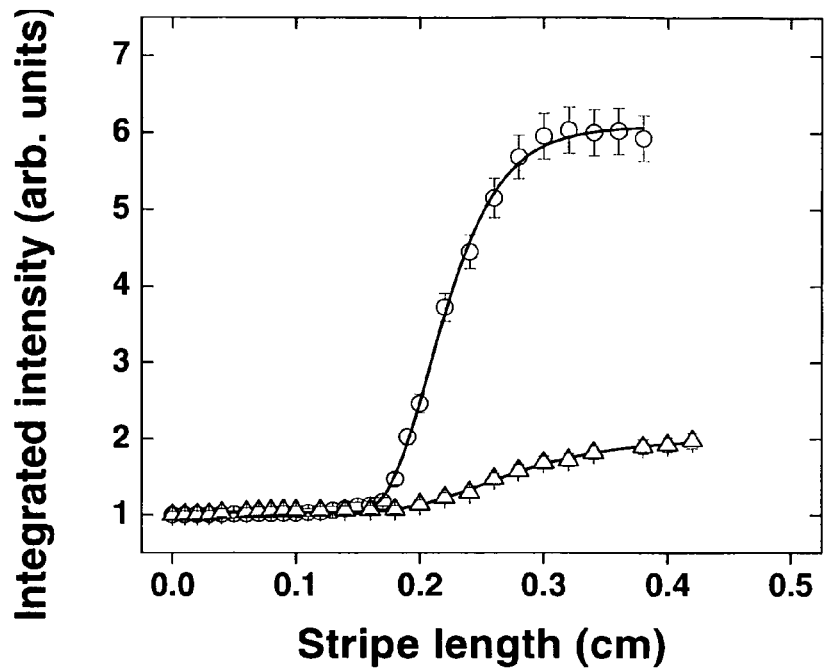
FIGS. 12C and 12D are graphs depicting optical properties of the device.
Figure 12D:
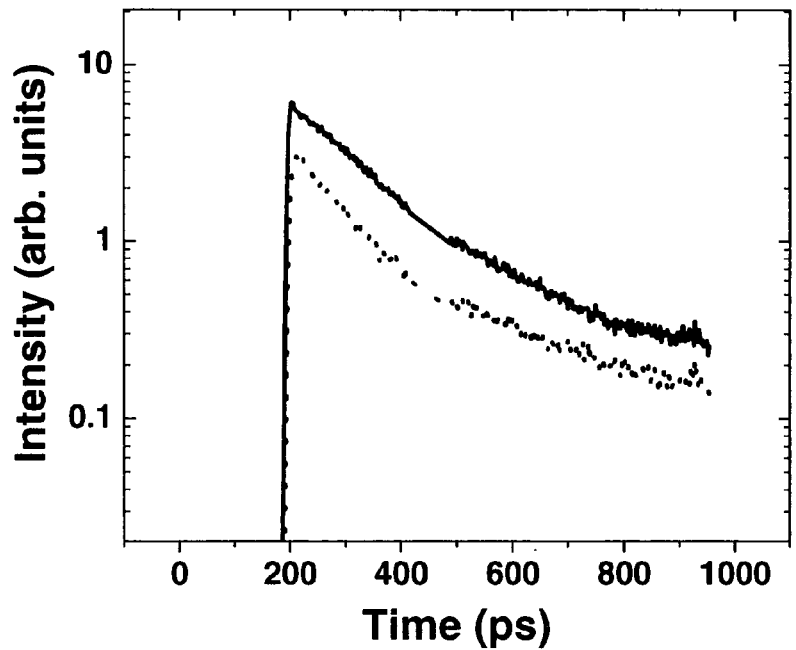

Variable stripe length (VSL) measurements on a silica film incorporating 4.1 nm CdSe/ZnS nanocrystals found a modal gain that increased from ~32 cm$^{-1}$ in water (triangles) to ~62 cm$^{-1}$ in the presence of 0.1 M AH (circles), as depicted in FIG. 12C. See, for example, Chan, Y. et al., Appl. Phys. Lett. 2005, 86, 073102, which is incorporated by reference in its entirety. Care was taken to ensure that the area of excitation as well as the excitation intensity was the same in both cases. Streak camera measurements on the photoluminescence intensity of a similar film, shown in FIG. 12D, revealed that the biexciton quantum yield was also increased upon optical excitation in the presence of AH. This suggested that AH played a role in neutralizing charged nanocrystals that are known to have extremely fast non-radiative relaxation pathways. See, for example, Efros, Al. L., et al., Semiconductor Nanocrystals: from Basic Principles to Applications, Klwer Academic, New York, 2003, which is incorporated by reference in its entirety. Neutralizing the charged nanocrystals leaves them available to participate in lasing. This also suggested that a charged biexciton had a non-radiative lifetime that was significantly faster than a charged exciton. The increase in the population of neutral nanocrystals subsequently contributed to the increase in both the single and bi-exciton quantum yield upon optical excitation, consistent with the observed increase in modal gain. Thus, certain amines can enhance both linear and non-linear optical properties of nanocrystals.

Other embodiments are within the scope of the following claims.

What is claimed is:

1. An optical resonator comprising:
a microsphere disposed on a substrate; and
a composite disposed over the microsphere and the substrate, the composite including a matrix and a chromophore.

2. The optical resonator of claim 1, wherein the microsphere has a dimension of less than 1 mm.

3. The optical resonator of claim 1, wherein the composite is adjacent to an outer surface of the microsphere.

4. The optical resonator of claim 3, wherein the composite substantially coats an outer surface of the microsphere.

5. The optical resonator of claim 1, wherein the chromophore is a semiconductor nanocrystal.

6. The optical resonator of claim 1, wherein the matrix includes silica, titania, or a mixture thereof.

7. The optical resonator of claim 1, further comprising a fluid flow path in fluid communication with the optical resonator.

8. An optical resonator comprising a microsphere disposed on a substrate and a composite including a matrix and a chromophore disposed over the microsphere and the substrate, wherein the composite forms a grating having a periodicity selected to provide optical feedback to the chromophore.

9. The optical resonator of claim 8, wherein the chromophore is a semiconductor nanocrystal.

10. The optical resonator of claim 8, wherein the matrix includes silica, titania, or a mixture thereof.

11. The optical resonator of claim 8, further comprising a fluid flow path in fluid communication with the optical resonator.

12. A laser comprising:
a microsphere disposed on a substrate; and
a composite disposed over the microsphere and the substrate, the composite including a matrix and a chromophore; and
an excitation source configured to excite the chromophore.

13. The laser of claim 12, wherein the excitation source is a light source.

14. The laser of claim 12, wherein the microsphere has a dimension of less than 1 mm.

15. The laser of claim 12, wherein the composite is adjacent to an outer surface of the microsphere.

16. The laser of claim 15, wherein the composite substantially coats an outer surface of the microsphere.

17. The laser of claim 12, wherein the chromophore is a semiconductor nanocrystal.

18. The laser of claim 12, wherein the matrix includes silica, titania, or a mixture thereof.

19. The laser of claim 12, further comprising a fluid flow path in fluid communication with the optical resonator.

20. A laser comprising:
a microsphere disposed on a substrate and a composite including a matrix and a chromophore disposed over the microsphere and the substrate, wherein the composite forms a grating having a periodicity selected to provide optical feedback to the chromophore; and
an excitation source configured to excite the chromophore.

21. The laser of claim 20, wherein the chromophore is a semiconductor nanocrystal.

22. The laser of claim 20, wherein the matrix includes silica, titania, or a mixture thereof.

23. The laser of claim 20, wherein the excitation source is a light source.

24. A method of making an optical resonator comprising:
arranging a microsphere on a substrate; and
depositing a composite including a matrix and a chromophore over the microsphere.

25. The method of claim 24, wherein the optical feedback structure has a dimension of less than 1 mm.

26. The method of claim 24, wherein the composite is deposited adjacent to an outer surface of the microsphere.

27. The method of claim 26, wherein the composite substantially coats an outer surface of the microsphere.

28. The method of claim 24, wherein the chromophore is a semiconductor nanocrystal.

29. The method of claim 28, wherein the semiconductor nanocrystal includes a ligand having an affinity for the matrix.

30. The method of claim 24, wherein the matrix includes silica, titania, or a mixture thereof.

31. The method of claim 24, wherein depositing the composite includes depositing a mixture including the matrix, the chromophore, and the microsphere on the substrate.

32. The method of claim 31, wherein depositing the mixture includes spin-casting the mixture.

33. A method of making an optical resonator comprising:
depositing a composite including a matrix and a chromophore on a substrate; and
shaping the composite to form a grating having a periodicity selected to provide optical feedback to the chromophore.

34. The method of claim 33, wherein shaping the composite includes contacting the composite with a patterned stamp.

35. The method of claim 33, wherein the chromophore is a semiconductor nanocrystal.

36. The method of claim 33, wherein the matrix includes silica, titania, or a mixture thereof.

37. A method of generating light comprising:
providing an optical resonator including:
a microsphere disposed on a substrate; and
a composite disposed over the microsphere and the substrate, the composite including a matrix and a chromophore; and
exciting the chromophore.

38. The method of claim 37, wherein the microsphere has a dimension of less than 1 mm.

39. The method of claim 37, wherein the chromophore is a semiconductor nanocrystal.

40. The method of claim 37, wherein the matrix includes silica, titania, or a mixture thereof.

41. A method of generating light comprising providing an optical resonator including:
a microsphere disposed on a substrate and a composite including a matrix and a chromophore disposed over the microsphere and the substrate, wherein the composite forms a grating having a periodicity selected to provide optical feedback to the chromophore; and
exciting the chromophore.

42. The method of claim 41, wherein the chromophore is a semiconductor nanocrystal.

43. The method of claim 41, wherein the matrix includes silica, titania, or a mixture thereof.

* * * * *